US007039194B1

(12) United States Patent
Kemp

(10) Patent No.: US 7,039,194 B1
(45) Date of Patent: May 2, 2006

(54) AUDIO EFFECTS SYNTHESIZER WITH OR WITHOUT ANALYZER

(76) Inventor: Michael J. Kemp, Casa Lucia, Vale Formosilho, S.Marcos da Serra, 8375 S.B., Des Messines (PT)

( * ) Notice: Subject to any disclaimer, the term of this patent is extended or adjusted under 35 U.S.C. 154(b) by 0 days.

(21) Appl. No.: 09/242,096

(22) PCT Filed: Aug. 8, 1997

(86) PCT No.: PCT/GB97/02159

§ 371 (c)(1),
(2), (4) Date: May 26, 1999

(87) PCT Pub. No.: WO98/07141

PCT Pub. Date: Feb. 19, 1998

(30) Foreign Application Priority Data

Aug. 9, 1996 (GB) .................................... 9616755

(51) Int. Cl.
*H03G 3/00* (2006.01)

(52) U.S. Cl. ........................... 381/61; 381/98; 381/103

(58) Field of Classification Search .................. 381/61, 381/63, 1, 104, 107, 106; 84/626, 662, 701; 379/93.05

See application file for complete search history.

(56) References Cited

U.S. PATENT DOCUMENTS

| | | | | | |
|---|---|---|---|---|---|
| 5,386,082 | A | * | 1/1995 | Higashi | 84/630 |
| 5,495,534 | A | * | 2/1996 | Inanaga et al. | 381/310 |
| 5,544,249 | A | * | 8/1996 | Opitz | 381/63 |
| 5,619,579 | A | * | 4/1997 | Ando et al. | 381/63 |
| 5,774,560 | A | * | 6/1998 | Su et al. | 381/63 |
| 5,796,849 | A | * | 8/1998 | Coleman et al. | 381/71.8 |
| 5,841,875 | A | * | 11/1998 | Kuroki et al. | |
| 5,982,902 | A | * | 11/1999 | Terano | 381/17 |
| 6,005,949 | A | * | 12/1999 | Shimizu et al. | |
| 6,055,502 | A | * | 4/2000 | Kitamura | 704/500 |

* cited by examiner

*Primary Examiner*—Brian T. Pendleton
(74) *Attorney, Agent, or Firm*—Wolf Greenfield & Sacks, P.C.

(57) ABSTRACT

The method is provided for simulating an audio effect processor. At least two impulse responses are stored representing the audio processor for input signals having different characteristics. The same characteristic of the input signal is then repeatedly assessed and at least one of the impulse responses selected to apply to the input signal in dependence on the result of the assessment. The selected impulse response is then applied to the input signal to derive an output signal. This process continues throughout the duration of the input signal, thereby taking account of time dependent changes in the assessed characteristics.

18 Claims, 20 Drawing Sheets

AUDIO EFFECTS SYNTHESIZER WITH OR WITHOUT ANALYZER

RELATED APPLICATIONS

This application claims priority benefits of UK Patent Application No. 9616755.6 filed Aug. 9, 1996 and PCT Application No. PCT/GB97/02159 filed Aug. 8, 1997.

FIELD OF THE INVENTION

A method and apparatus are provided for simulating an audio effect processor, and more particularly, for applying an impulse response or impulse responses selected from a plurality of stored impulse responses to an input signal to achieve a desired output.

BACKGROUND OF THE INVENTION

In audio recording for music or film it is often desired to pass an audio signal through an effect unit to alter the sound in a desirable way, for example, in film work a recording may be made to sound as if it were coming through a telephone, from a distance or in a room with characteristic sound quality even though the original sound was recorded in a dead acoustic of a studio. In music work more severe distortions may be required, for example passing the signal through a guitar amplifier and speaker which is allowed to distort and back into a microphone, or through an analogue recording cycle onto and back from magnetic tape which is often considered to add a desirable sound quality.

Many devices exist to process signals in these ways, some specific to individual effects and some programmable to generate a range of effects on demand. The purpose of this invention is to allow the simulation of a large variety of such effects and further to allow existing effects to be analyzed and the characteristics of the effect to be stored and simulated on demand.

SUMMARY OF THE INVENTION

In accordance with the above, this invention provides a method and apparatus for simulating an audio effect processor which includes storing the impulse response of the audio processor for at least two impulses, repeatedly assessing a characteristic of an input signal, selecting at least one of the impulse responses to apply to the input signal in dependence on the result of the assessment, and applying the selected impulse response to the input signal to derive an output signal. The storing of the impulse response may involve storing at least two sets of digital samples representing the at least two impulse responses and the applying of the stored impulse response may involve convolving each of a first set of digital samples representing the assessment of the characteristic of the input signal with the selected set of digital samples representing the selected impulse response appropriate to the characteristic to give a second series of digital samples representing the output signal. The assessing of a characteristic of the input signal may also involve assessing its amplitude and the selecting of an impulse response to apply to the input signal may involve determining whether the amplitude of the input signal is above or below a predetermined threshold. For this embodiment, the step of selecting an impulse response to apply to the input signal may involve determining whether or not the amplitude of the input signal falls within a predetermined range, applying more than one impulse response to the input signal if the result of the determination is that the amplitude of the input signal falls within the predetermined range and deriving the output signal therefrom. A plurality of impulse responses may be applied to the input signal, the applied impulse responses being applied in proportions which sum substantially to one. The proportions of the impulse responses applied to the input signal may be dependent on the position of the amplitude of the input signal within the predetermined range.

The selecting of an impulse response to apply to the input signal may involve detecting a user input and selecting the impulse response dependent thereon. Alternatively, the selecting of an impulse response to apply to the input signal may involve monitoring a time dependent variable and selecting an impulse response in dependence thereon. Impulse responses may also be stored for a plurality of different audio processors.

The foregoing and other objects, features and advantages of the invention will be apparent in the following more particular description of preferred embodiments of the invention as illustrated in the accompanying drawings.

IN THE DRAWINGS

The invention is described by means of reference to the attached figures which are described in detail after the following summary explanation.

Figure 8:
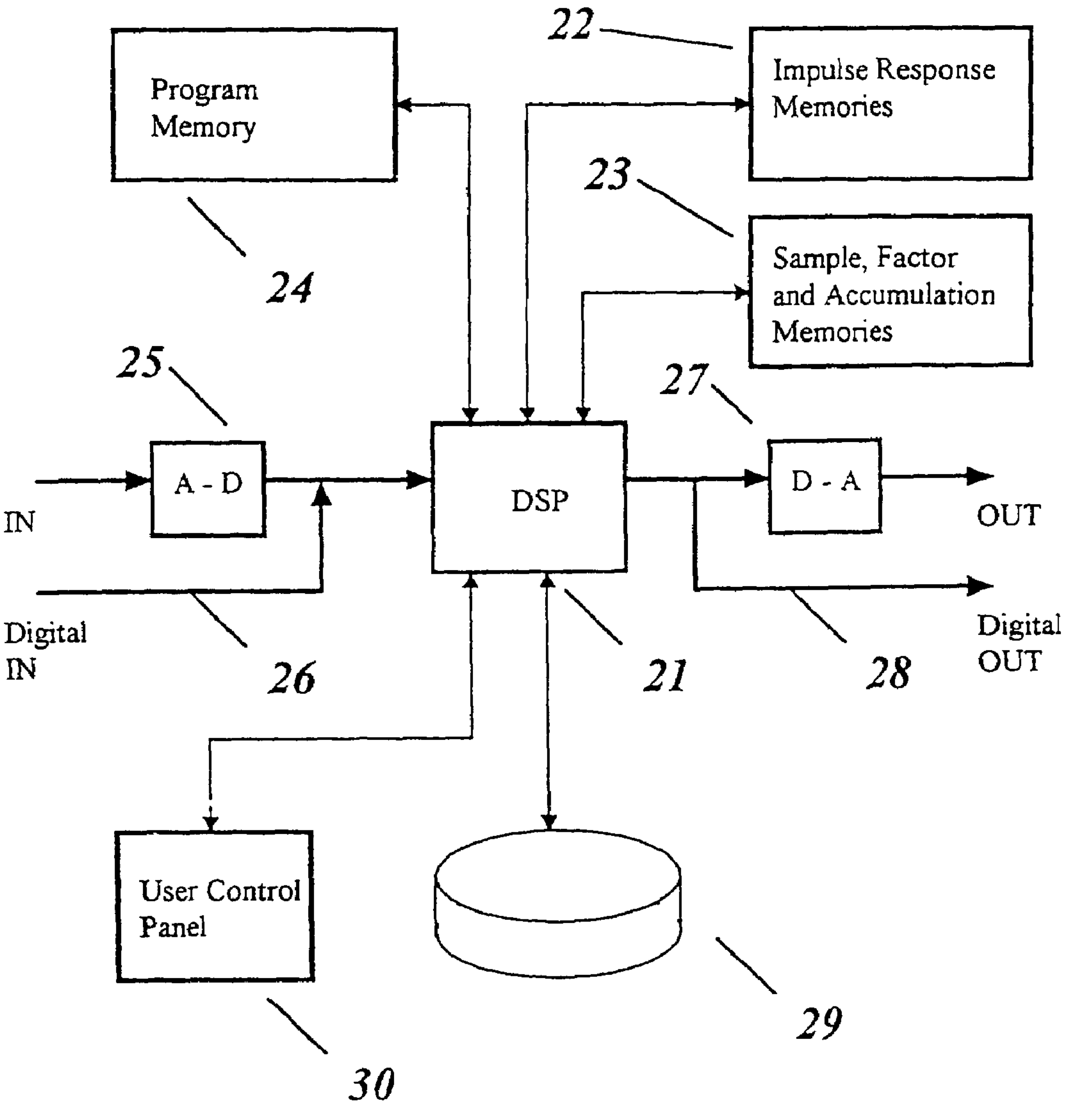
Figure 10:
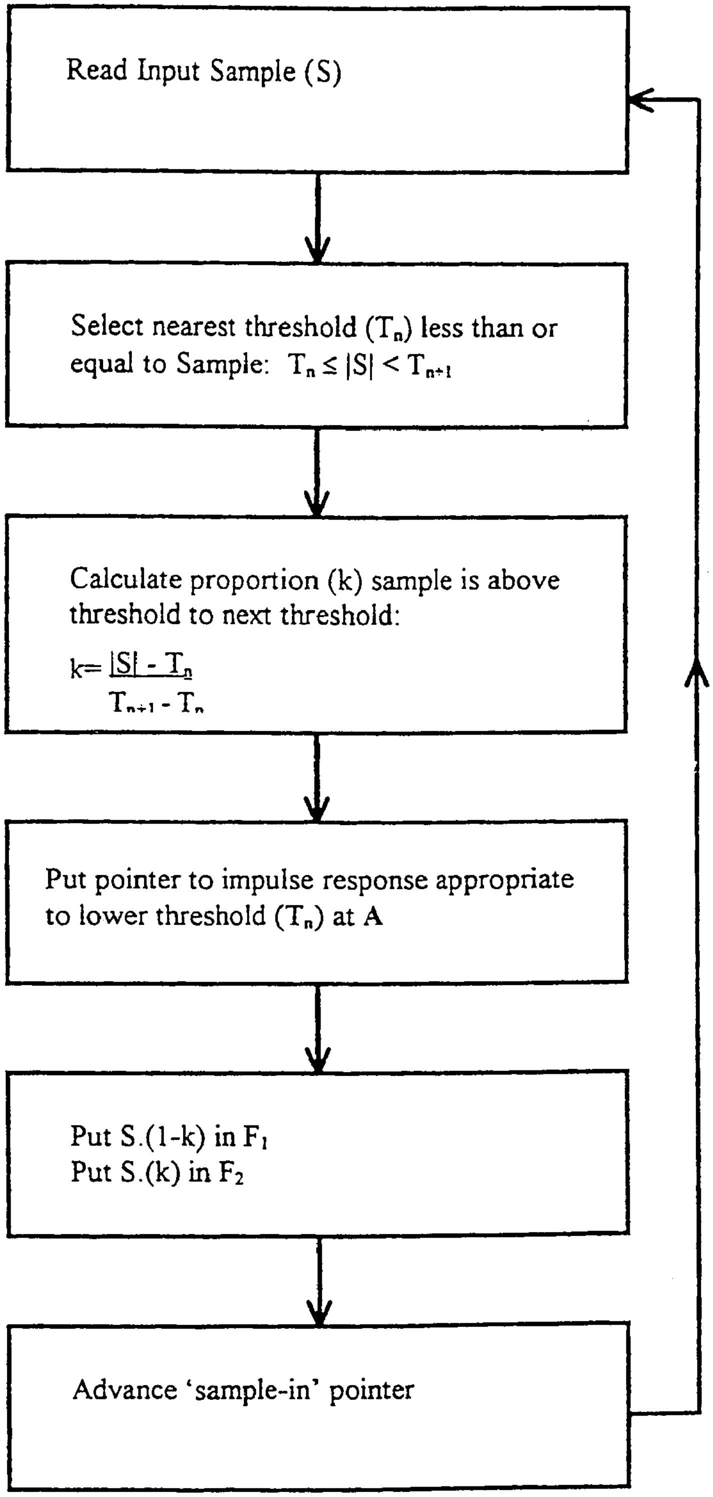

FIG. 8 shows an arrangement of DSP and memory which can implement the steps of (i) analysing a device by means of generating impulses, storing the responses returned from an effect under analysis and performing various 'tidying up' algorithms as described below to create the stored impulse responses, (ii) reading an input sample and generating the sample, factor and address data for storage in memory as shown in FIG. 10, and (iii) executing the algorithm of FIG. 12 to generate each output sample after each input sample has been read in, compared with impulse response thresholds, and stored. A fixed or removable disc drive may also be provided for program storage, long-term storage of response data and exchange of data between machines.

Figure 9:
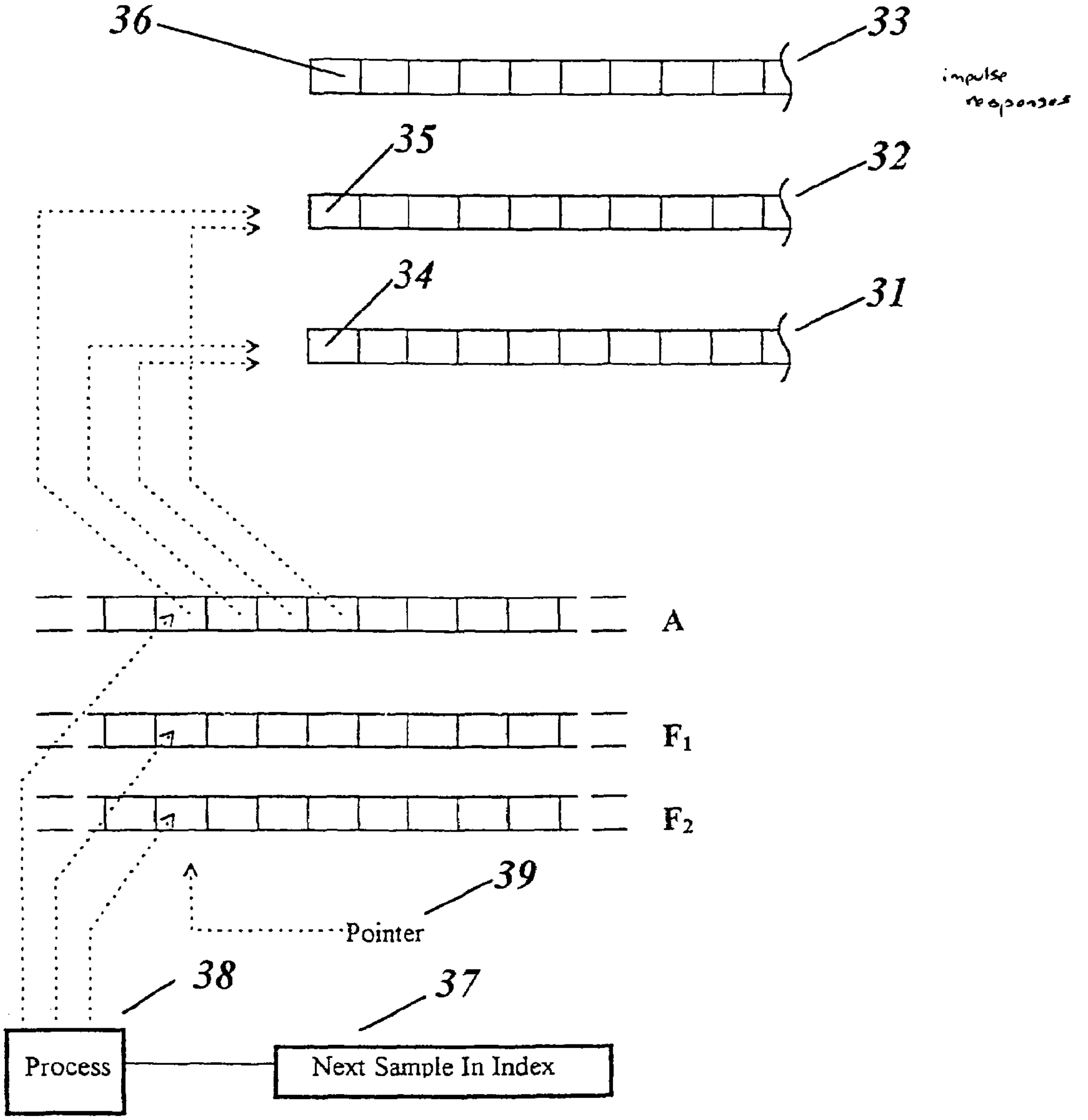

FIG. 9 shows part of one method of implementing the simulation process wherein an input sample is analysed once to determine two impulse responses to be applied to it, where the start address of the impulse response stream in memory of the lower response appropriate to this sample is stored, and where the sample is divided proportionally as determined by the proximity of the sample amplitude to the two impulse response amplitudes ready for subsequent processing.

Figure 11:
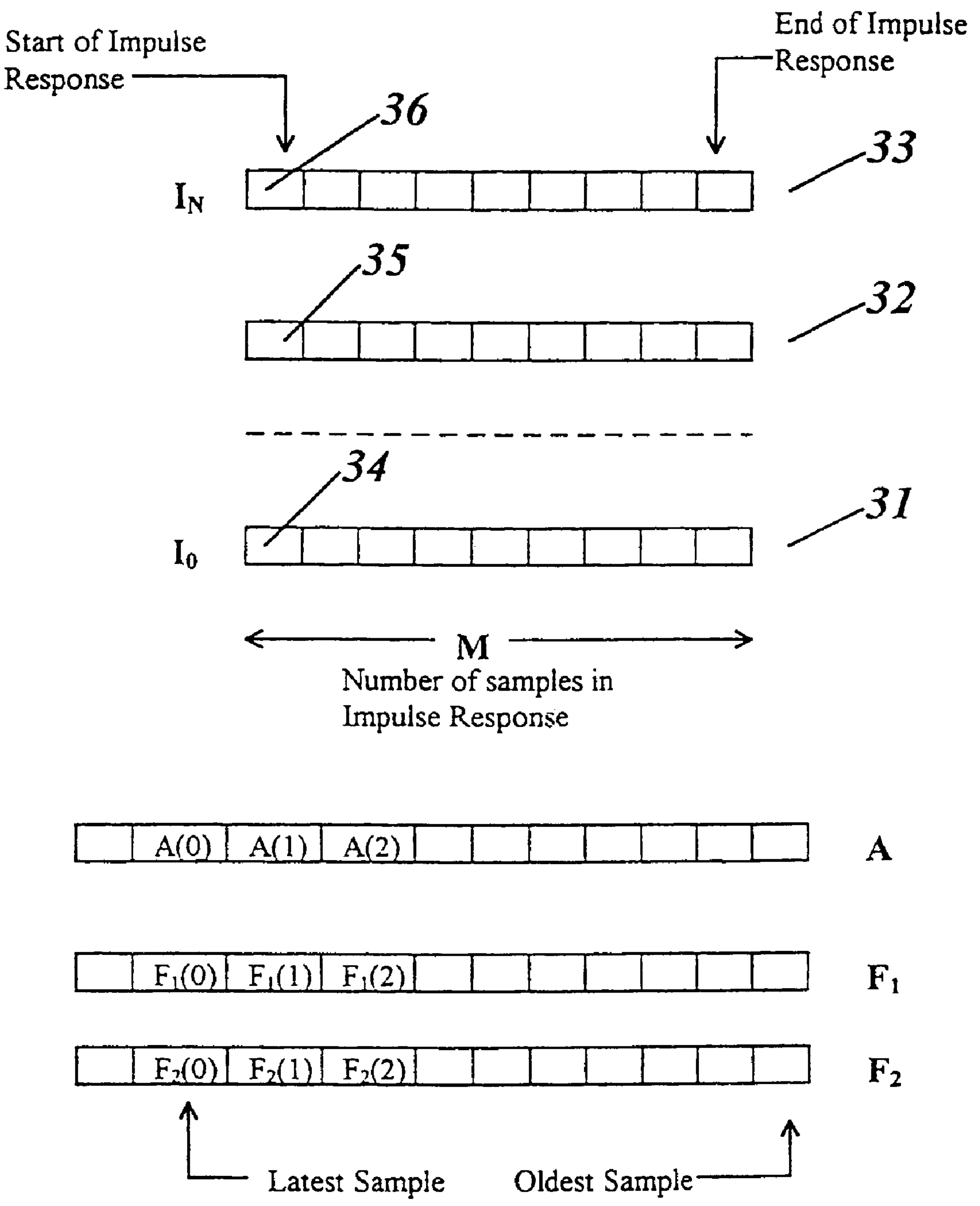

FIG. 10 shows the algorithm to be applied to derive the values to be stored in FIG. 9, FIG. 11 shows the arrangement in memory after the most recent input sample has been divided and placed in memory at $F_1(\mathbf{0})$ and $F_2(\mathbf{0})$ together with the selected address of the lower of the two appropriate impulse responses stored at A(0). The previous samples derived values are stored at $F_1(\mathbf{1})$,$F_2(\mathbf{1})$, $F_1(\mathbf{2})$, $F_2(\mathbf{2})$ etc together with their associated A pointers for sufficient previous samples to at least equal the length of the impulse responses used in the simulation.

Figure 12:
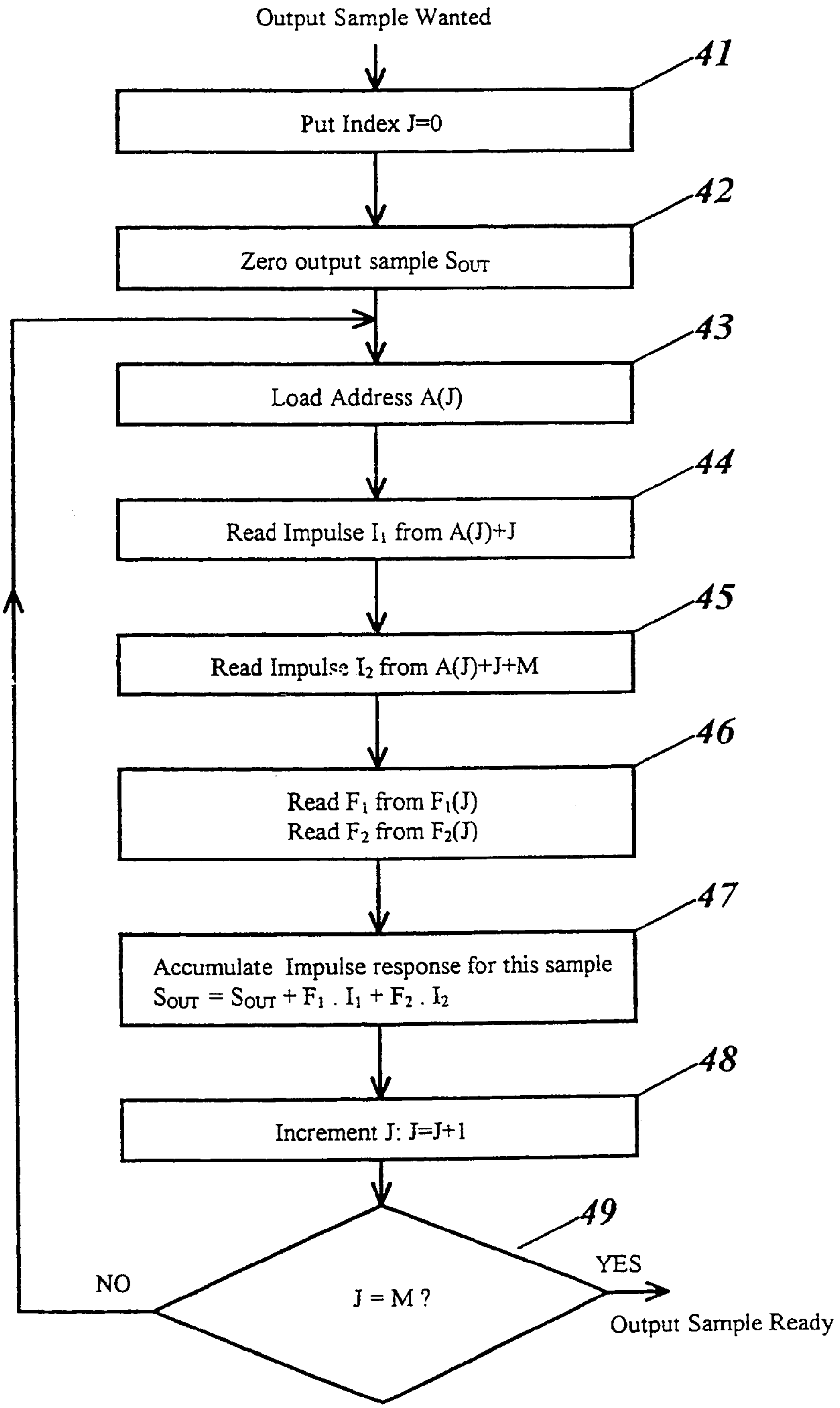

FIG. 12 shows the algorithm used to calculate an output sample from the data stored in memory in FIG. 11.

Figure 13:
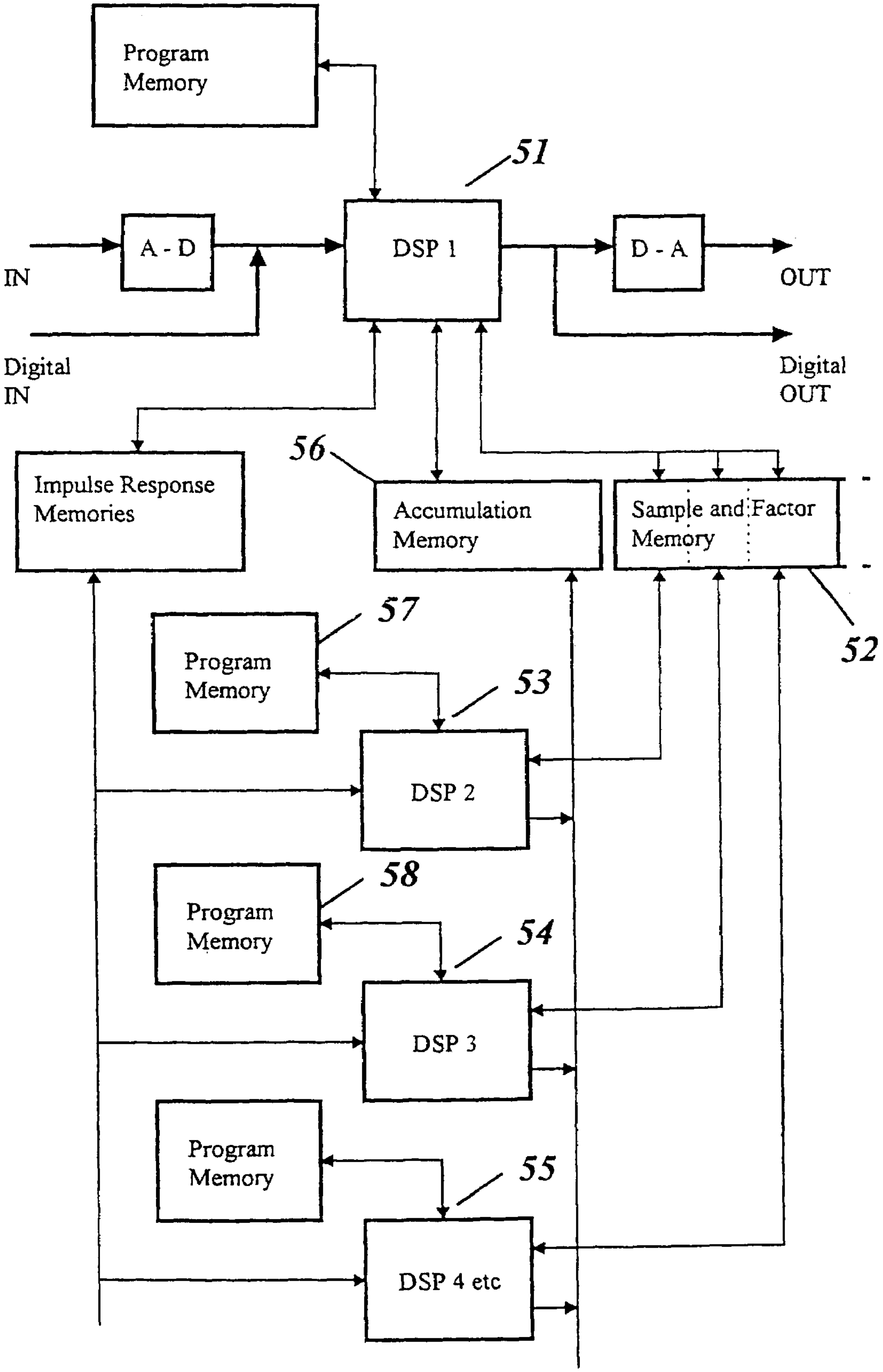

FIG. 13 shows one possible multiple processor implementation wherein DSP1 is used first to analyse an effect and generate the sampled impulse responses, then is used during the simulation phase to generate the sample and factor memory entries. This memory is segmented into a number of areas each of which is accessible to its own DSP (2,3,4 . . . ) which can thus calculate part contributions to each output sample. These part sums are then fed back to DSP1 to be summed to generate the total output sample and fed to the output.

Figure 14:
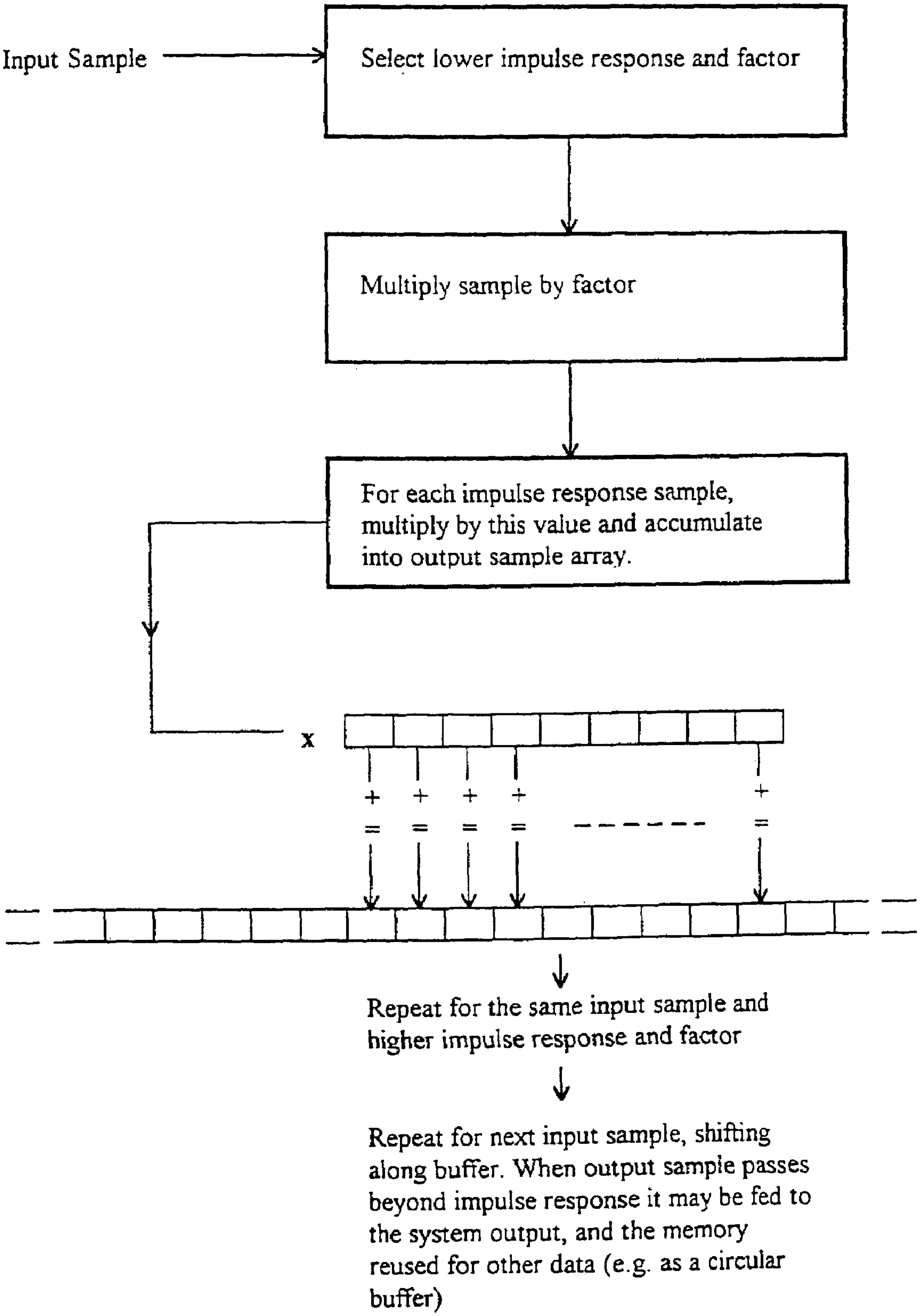

FIG. 14 shows an alternative way to implement the simulation algorithm where the heavily repeated inner loop of the convolution algorithm is simplified for maximum speed of execution, requiring a simple multiply of each element of the impulse response buffer and accumulation into each element of the output sample buffer.

Figure 15:
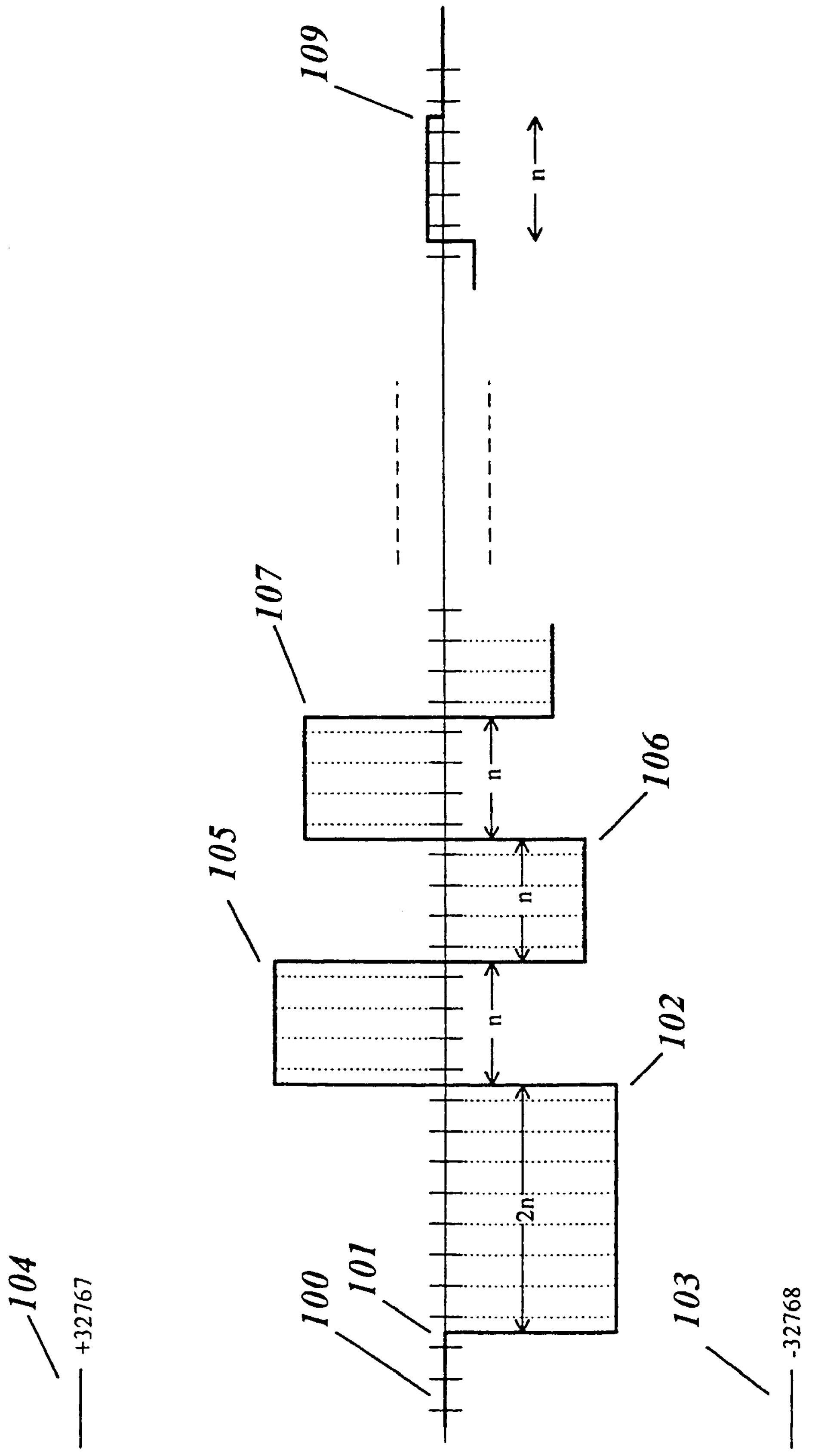
Figure 16:
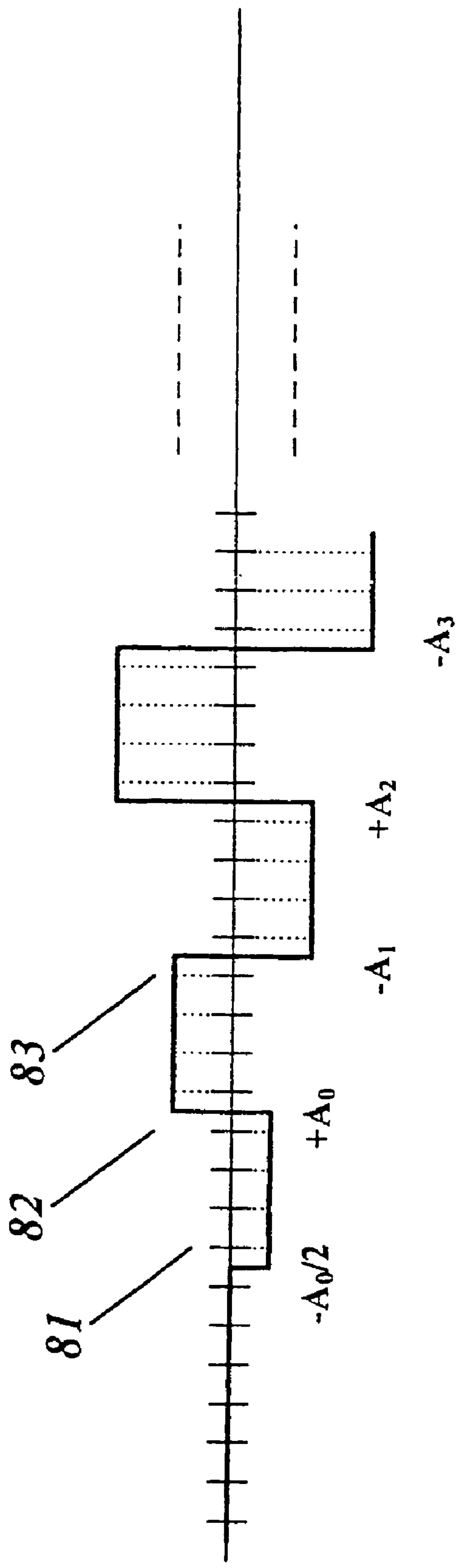
Figure 17:
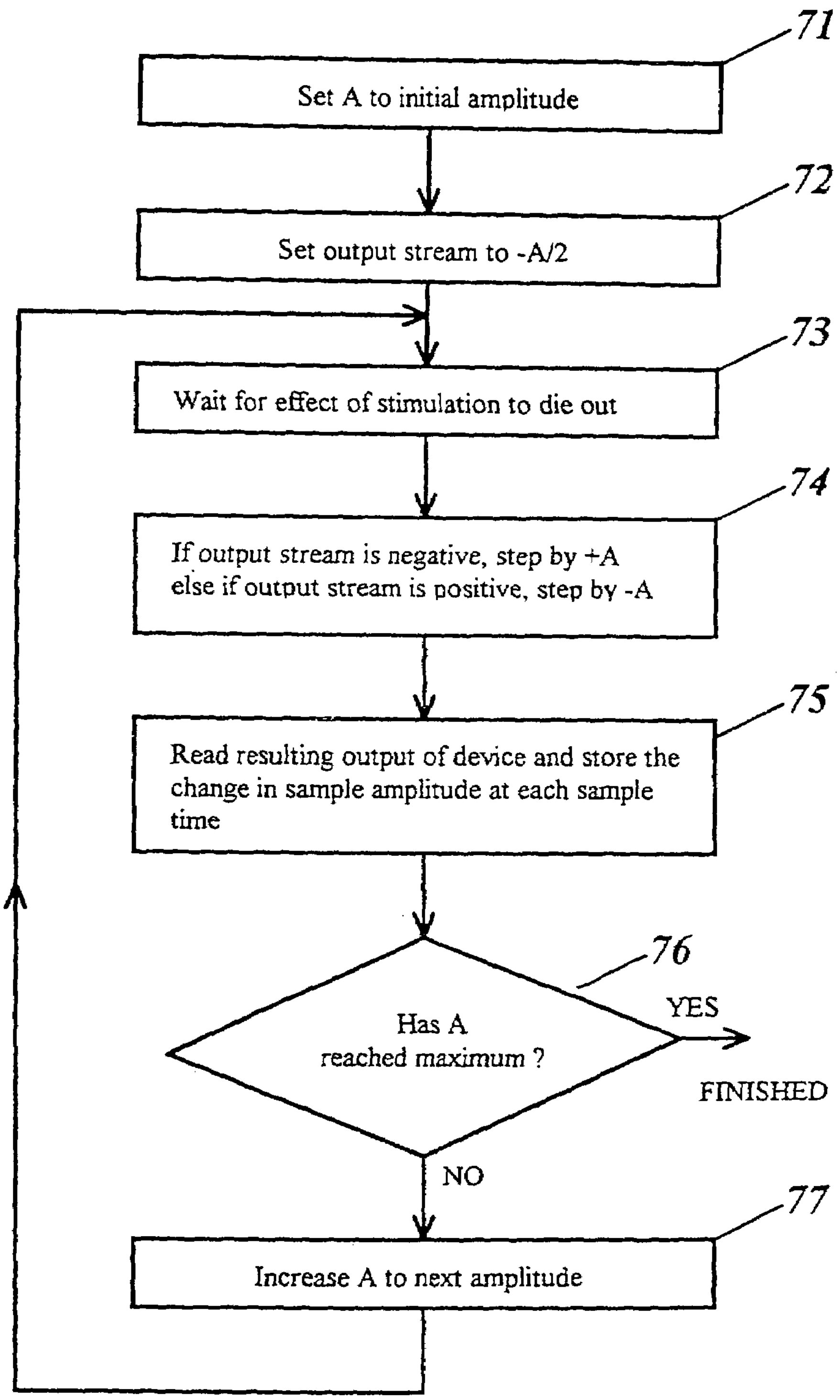

FIG. 15 shows the digital signal of an appropriate analysis tone which may be applied to a device under test remotely from the tone generating and analysis device by, for example, recording the test signal and applying it to the device under test and recording the impulse responses resulting for later analysis FIG. 16 shows an alternative test signal which may be used when the device under test is available at the same time as the generator and analyser device FIG. 17 shows a flow diagram of a process to generate the test pulses of FIG. 16 and record the impulse responses during analysis.

Figure 18:
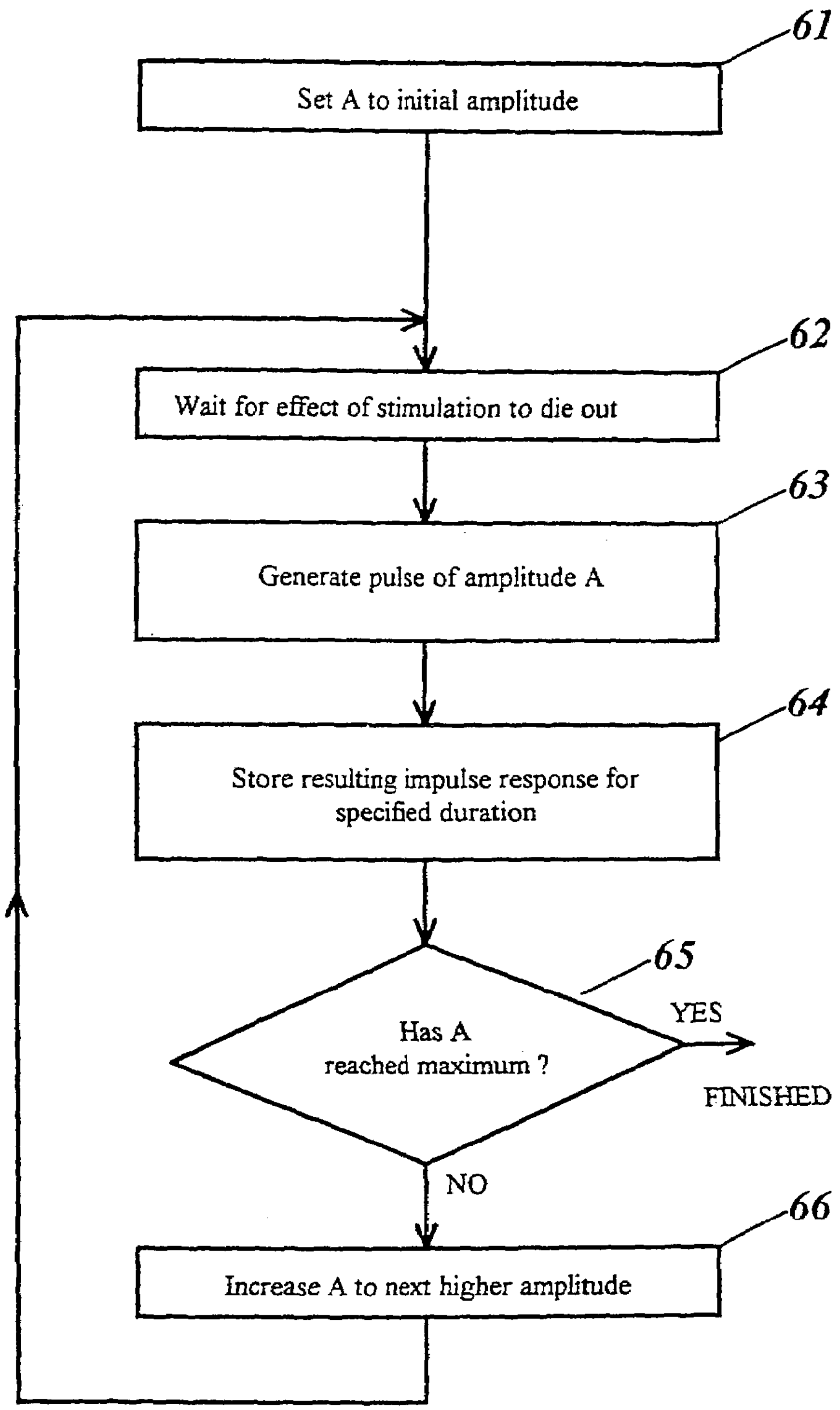

FIG. 18 shows a flow diagram of an alternative process to generate impulse test pulses rather than a stepped test pulse and to record the impulse responses during analysis.

Figure 19:
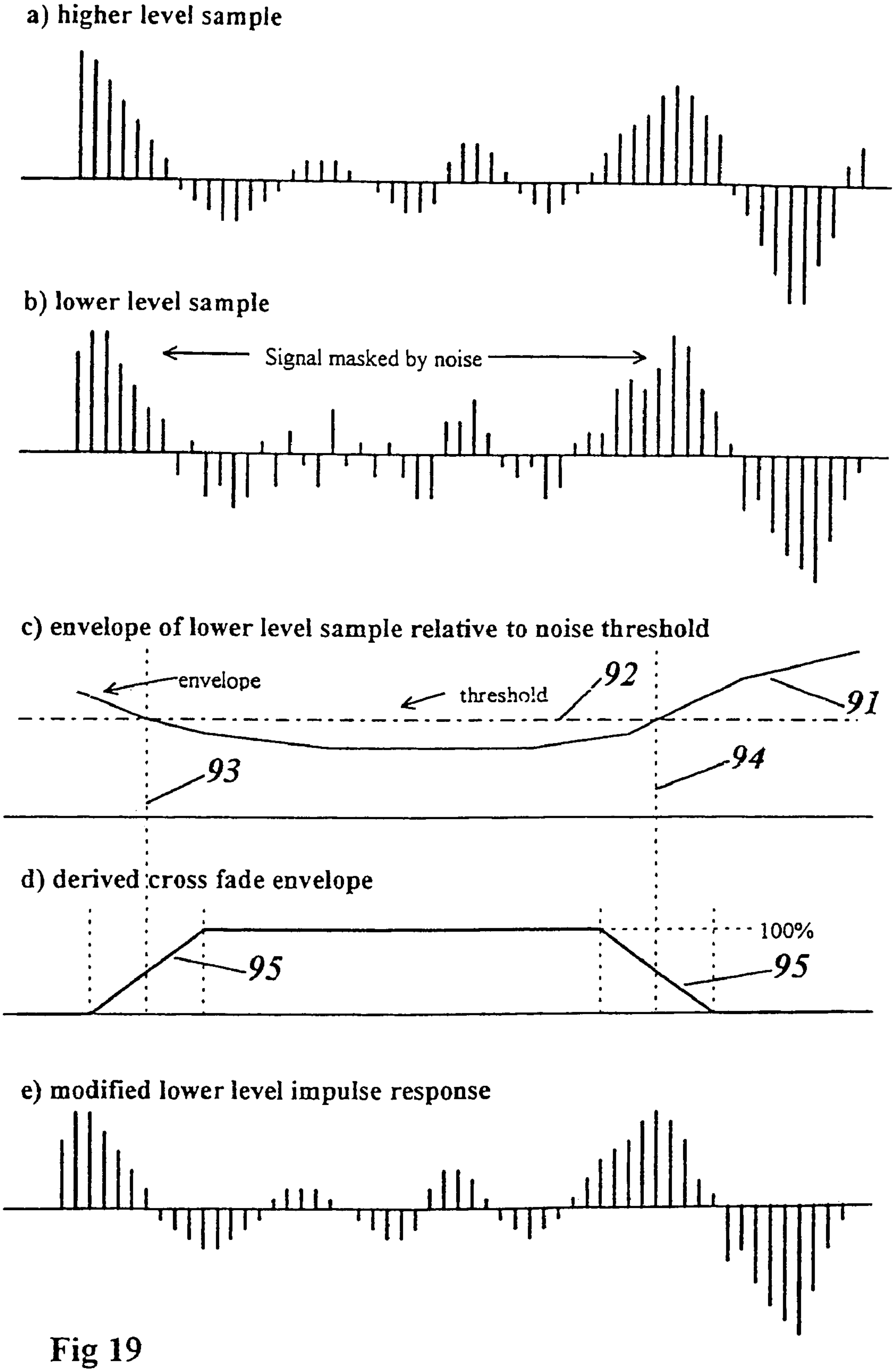

FIG. 19 shows a noise removal strategy where impulse responses derived from lower amplitude impulses may be selectively replaced by impulse responses from higher amplitude impulses in areas where the mean amplitude of the impulse response falls below a threshold representing the approach to a noise floor which would impair the simulation process.

Figure 20:
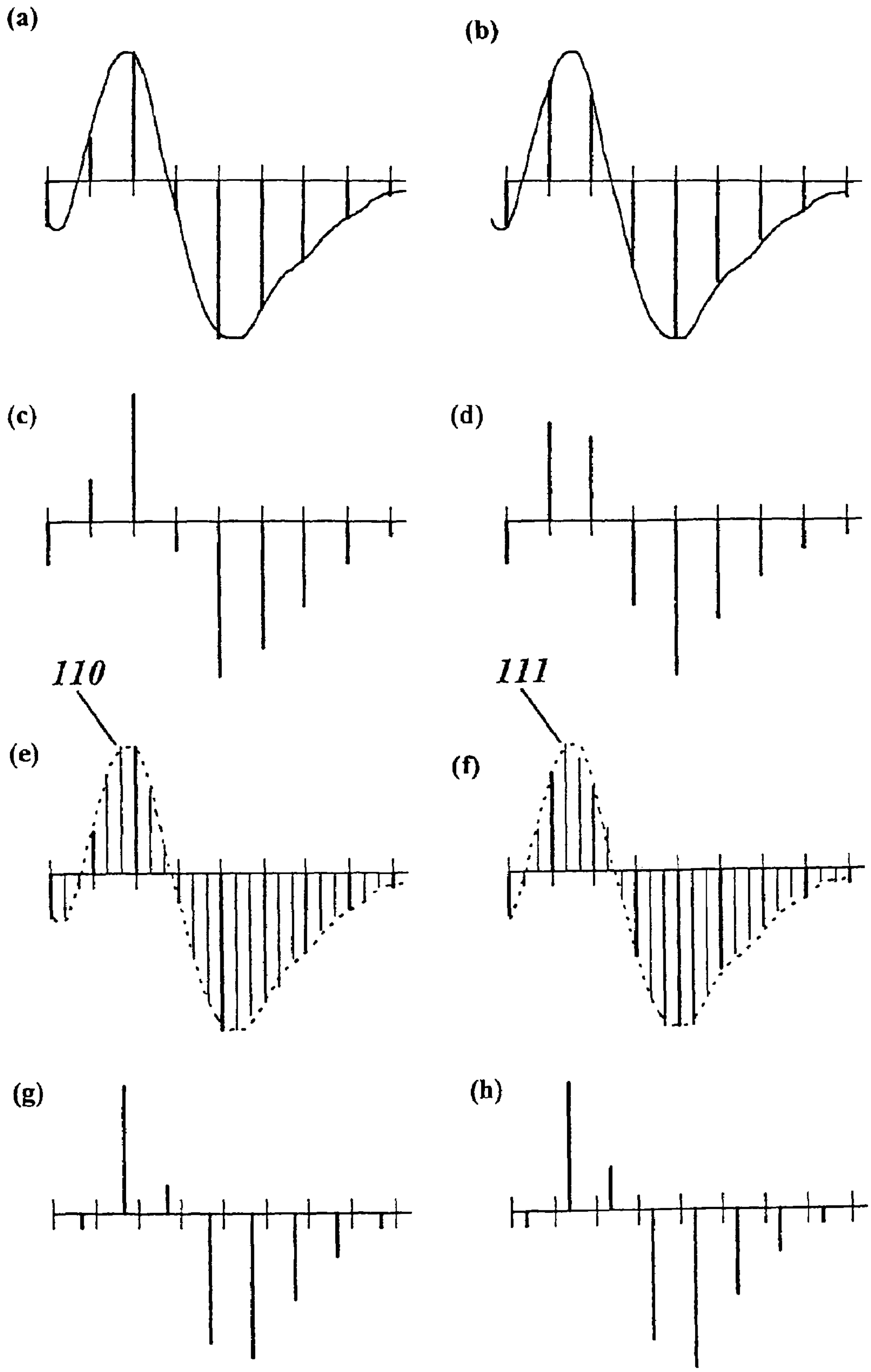

FIG. 20 shows the process of removing jitter from a signal recovered from a device or process under test, for example where there is randomised delay in the device (e.g. wow and flutter) or where the sampling process clock is not locked digitally to the analysis tone generator.

Figure 21:
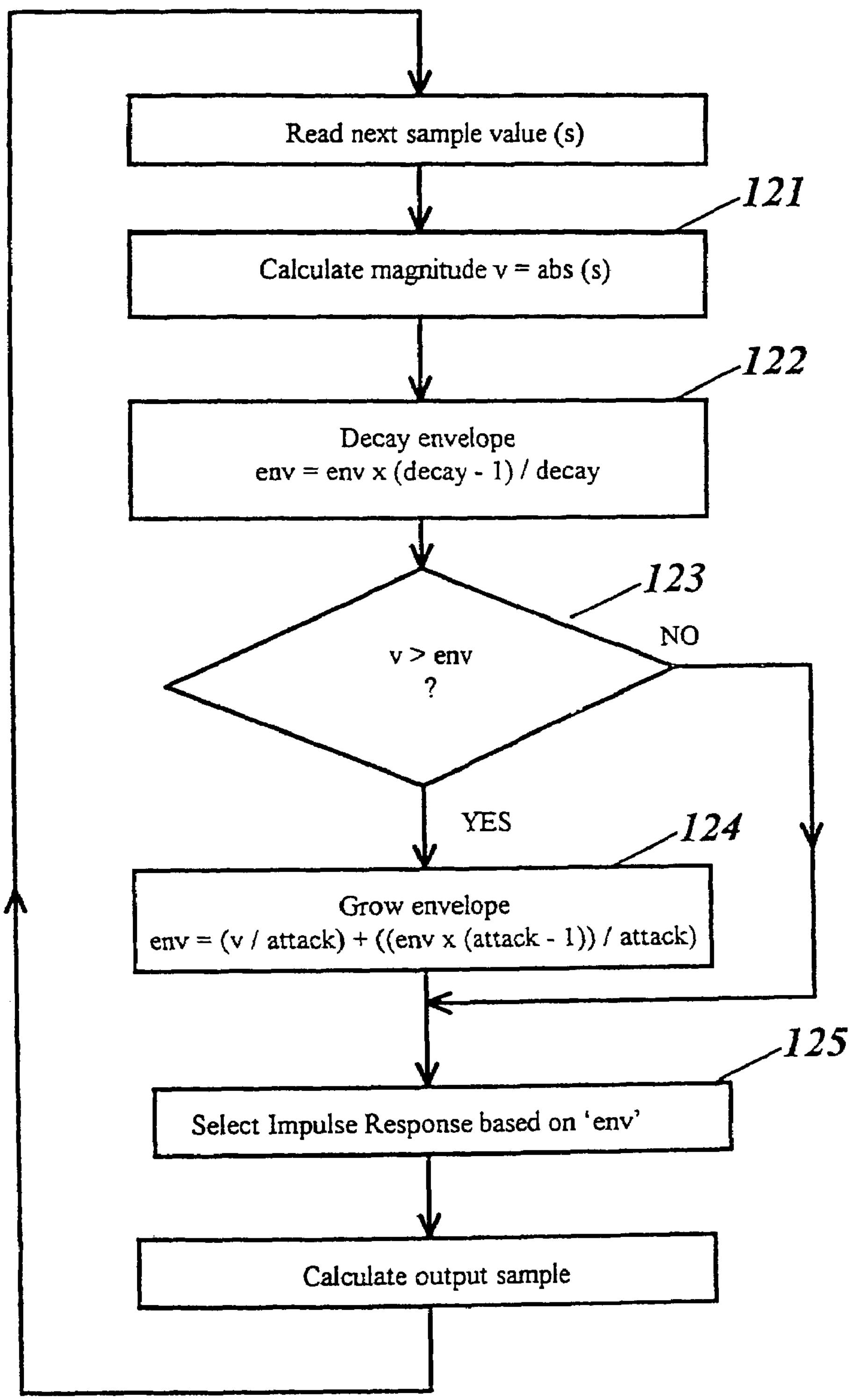

FIG. 21 shows the steps required to select between impulse responses based on the envelope of the incoming signal rather than instantaneous amplitude.

DETAILED DESCRIPTION

Analysis and Simulation of Linear Systems

Figure 1:
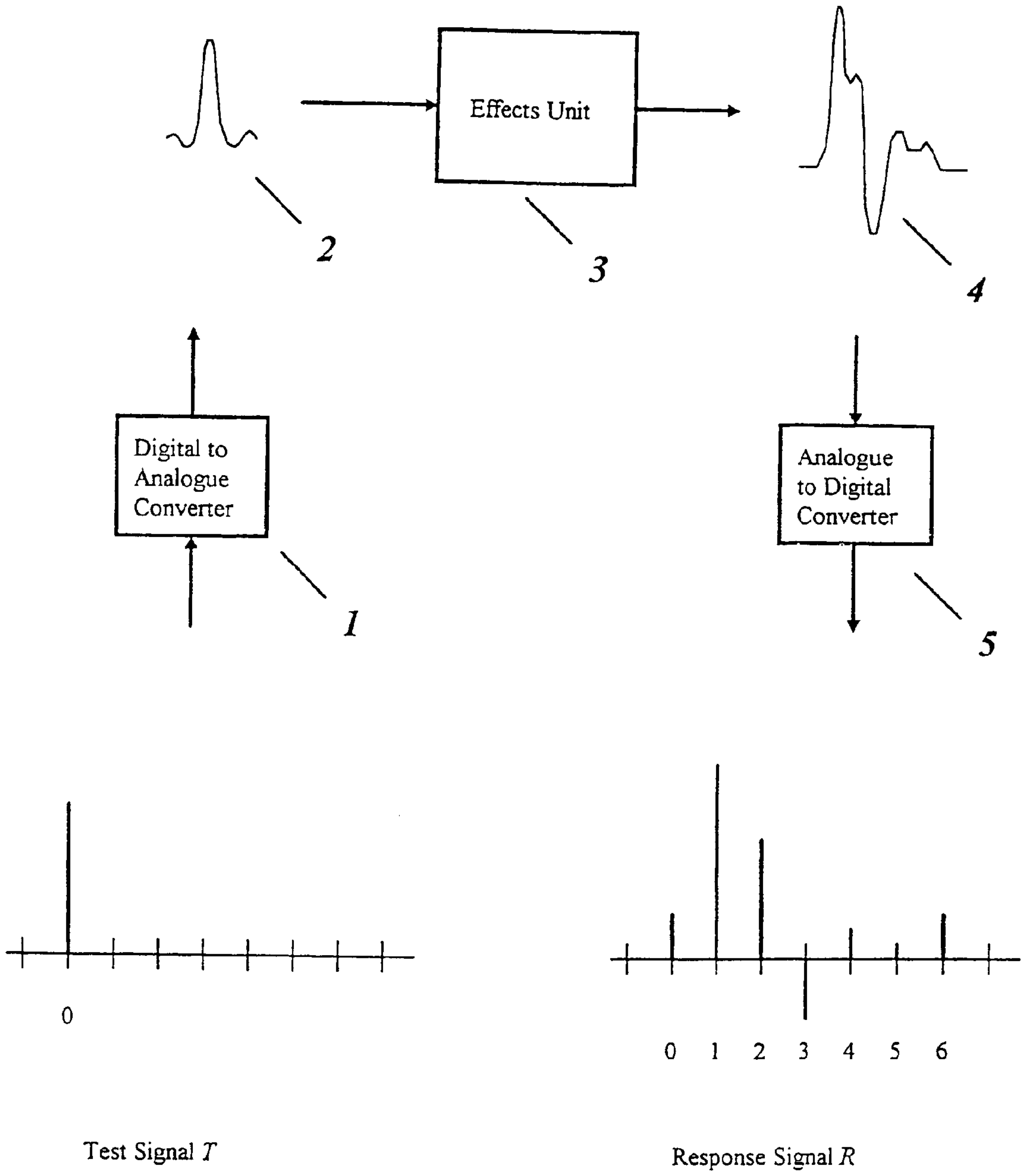
FIG. 1 shows the process of analyzing an existing effect unit by means of applying an impulse and recording its impulse response.
Figure 2:
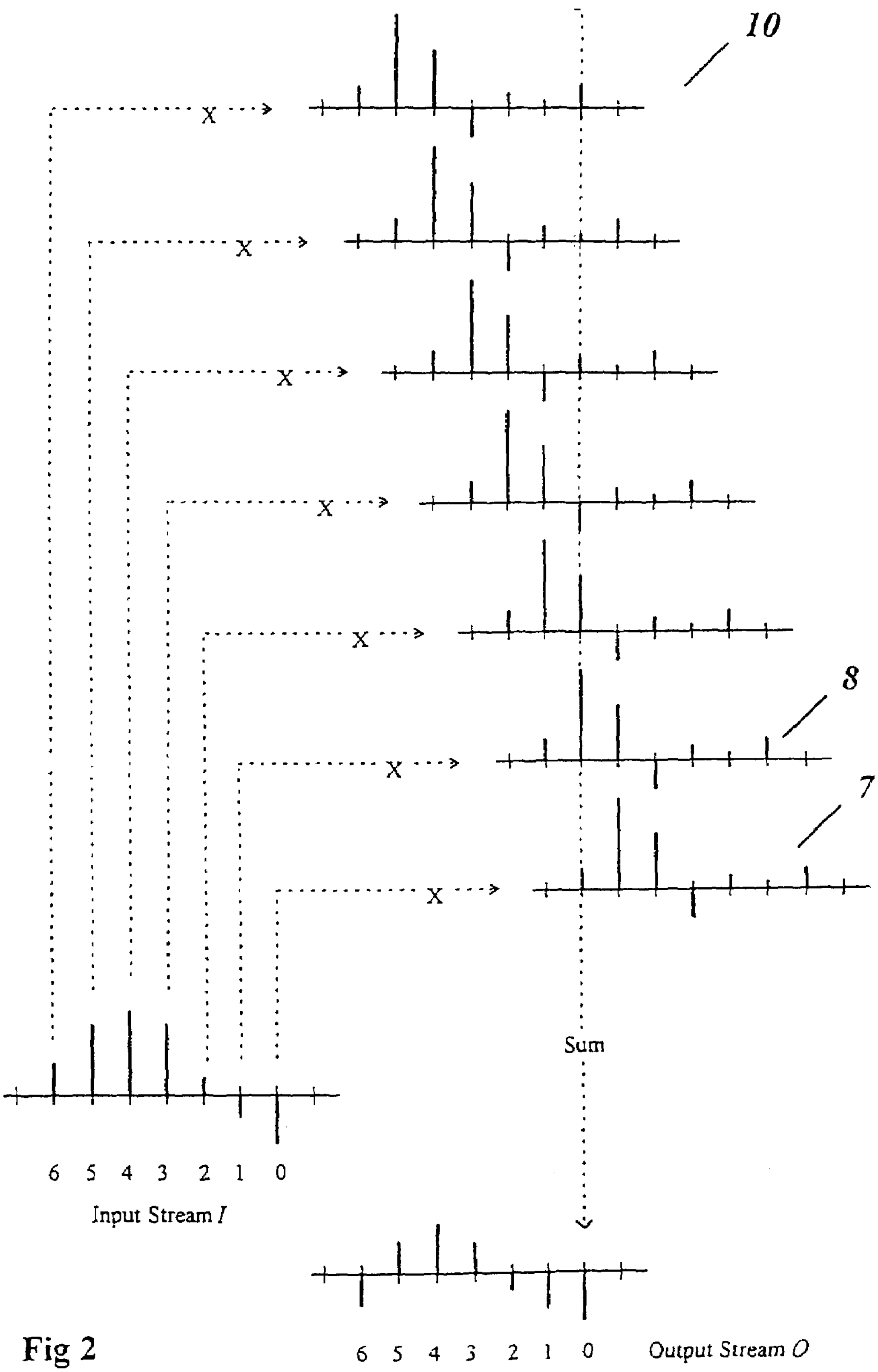
FIG. 2 shows the application of an input sound stream to generate a processed output stream by convolution with the sampled impulse response.

It is known that the transfer characteristic of a linear audio processor can be characterised by its impulse response. A single pulse can be passed through an effect unit and the resulting signal which emerges can be recorded as a sequence of digital samples. The effect can then be simulated in the digital domain by convolving a digital input stream with this impulse response to produce a digital output stream which matches that which would have emerged from the sampled effect unit. The impulse response can be stored for recall later. This is illustrated in FIG. 1 where an impulse T is applied via a D/A converter 1 to produce an analogue impulse 2 which is fed into effect unit 3. The output impulse response waveform 4 is fed via digital to analogue converter 5 and the resulting impulse response R is measured and stored. FIG. 2 shows how the resulting impulse response R is used to calculate an output stream 0 from input stream I. The most recent sample received and output is suffixed 0, with progressively older samples suffixed 1, 2, 3 etc. Output sample O(0) is derived by taking the most recent input sample I(0) is derived by taking the most recent input sample I(0) and multiplying this by the first sample of response R (R(O) shown at 7), summed (or accumulated) with the product of I(1) and the next older impulse sample (R(1) shown at 8) and so on until the oldest input sample required I(6) is multiplied by R(6) (shown at 10) is accumulated to make the latest output sample O(0). Thus the input stream of data I representing an input audio signal is convolved with the single impulse response R to produce each sample in output stream 0. Although 6 samples are referred to here for the length of the impulse responses, this is for clarity only and in practice many more samples are used. Although multiple output samples are shown, in fact it is not necessary to store these values as a new output sample is derived when each new input sample is received and may be fed directly to the output.

Where the effect unit to be analysed already has digital input and/or output the D/A (1) or the A/D (5) may not be required as the digital signals can simply be fed to or fed back from the effect unit.

Extension to Non-Linear Systems

Figure 3A:
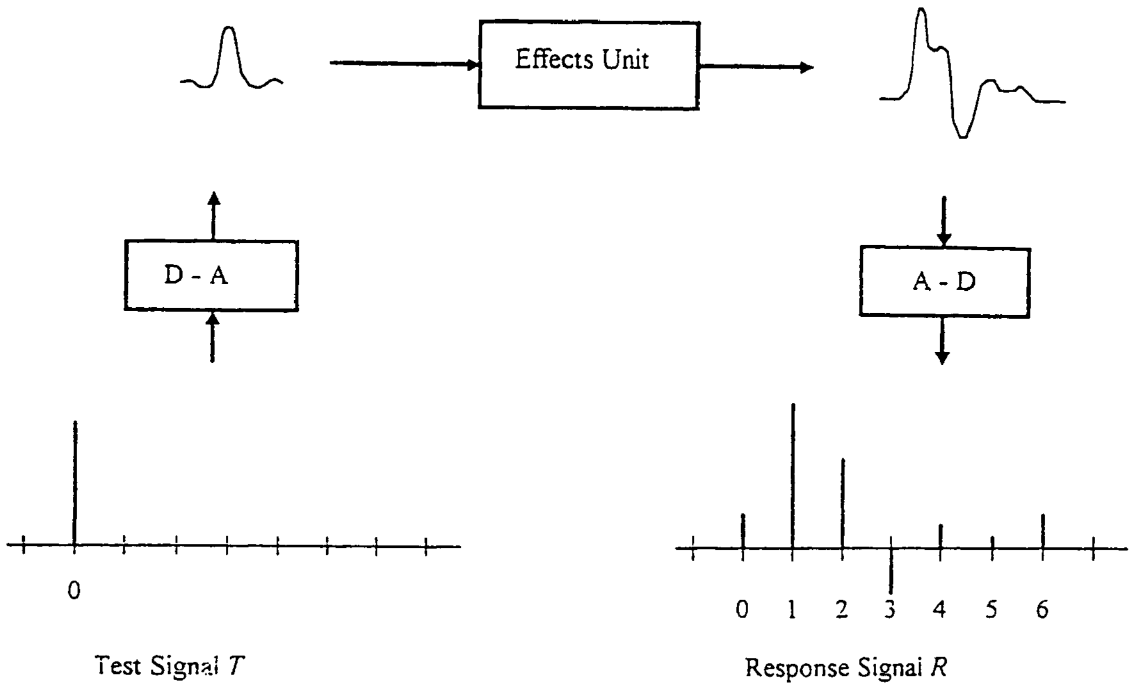
FIG. 3 shows the application of impulses of different magnitudes to an effect unit to obtain more than one impulse response appropriate to different impulse amplitudes.

Many effects including some of those mentioned above are non linear in nature and the response of a signal path depends on the level of signal passing through the unit. According to this invention it is possible to analyse such an effects unit by applying a number of different impulses of different amplitude and to store a different resulting impulse response from each exciting impulse. This is illustrated in FIG. 3 for two different pulse amplitudes at FIG. 3(*a*) and FIG. 3(*b*). FIG. 3(*a*) duplicates the process shown in FIG. 1, using a sample pulse T of maximum amplitude to determine the response of the system under maximum amplitude conditions. FIG. 3(*b*) duplicates the test but using a lower amplitude impulse T', for example half the amplitude of the pulse in FIG. 3(*a*). The resulting impulse response is shown at R. This is then increased in amplitude to produce the response at R' by multiplying each sample by the ratio of the maximum sample amplitude at T over the lower sample amplitude at T'. This process is known as normalisation.

In practice, to obtain a good analysis of the non-linear response of the system, a number of different impulse levels are applied and a set of impulse responses (normalised to maximum amplitude) are obtained. Typically a set of 128 or 256 impulse responses are used using an equally spaced set of sample impulses from the maximum level down to 1/128 (or 1/256 in the latter case) of the maximum level. In the case of 128 steps being used the response of the system is thus determined for signals from the maximum level down to 42 dB below this, at which point most effects have become linear.

Figure 3B:
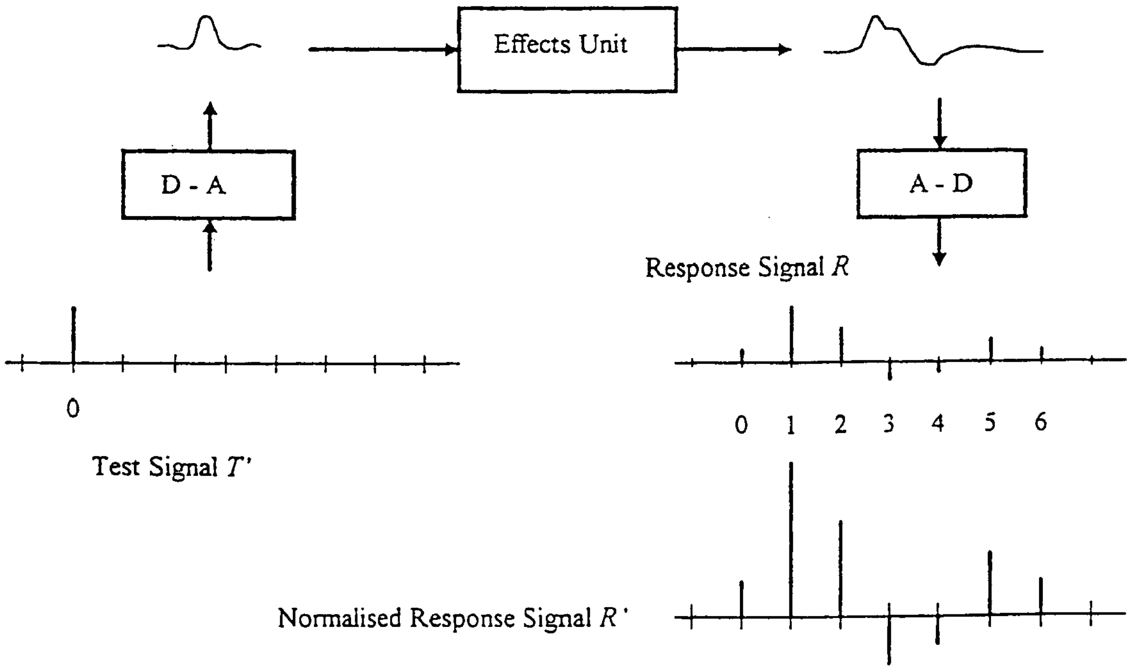
Figure 4:
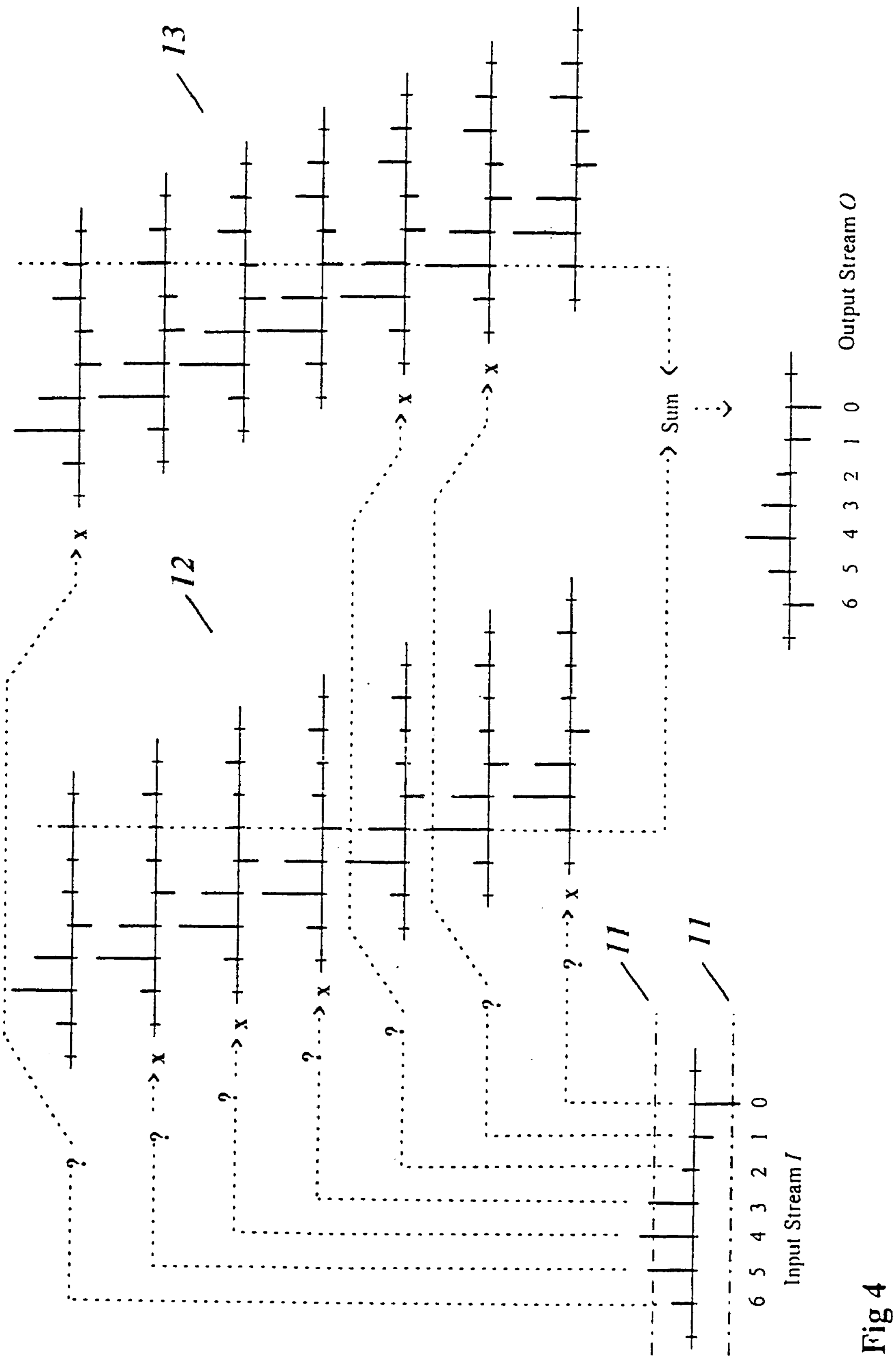
FIG. 4 shows the application of an input stream to generate a processed output stream by modifying the convolution so that a different impulse response may be applied to different input samples—in this case depending on amplitude of the input sample compared with a threshold shown chain-dotted.

After obtaining the set of impulse responses it is possible to simulate the non-linear effect. When simulating the effect it is necessary to examine each input sample and depending on the magnitude of the sample to use the appropriate impulse response in the convolution. This is shown in FIG. 4 for the case where the set of impulse responses uses just the two responses obtained in FIG. 3 and by comparison with FIG. 2. Each input sample (at I) needed to make up the output sample is compared against the threshold determined by the magnitude of the lower impulse of FIG. 3*b*, shown as chain-dotted line 11. If the magnitude input sample exceeds this threshold (i.e I(3), I(4) and I(5)), the impulse response of the higher amplitude pulse (shown replicated for each input sample considered at 12) is used in the convolution. If the magnitude of the input sample is below the threshold (i.e. I(0), I(1), I(2), I(6)) the impulse response of the lower amplitude impulse (13) is used in the convolution calculation. Once again all contributing products of input samples and appropriate impulse response are summed to generate the desired next output value O(0).

This process can be extended to use the impulse responses of any number of different impulse amplitudes by comparing the input sample against a number of thresholds. In the example where there are 128 equally spaced test impulses used to derive the impulse response set, the appropriate response to use for any sample can be simply obtained by truncation of the magnitude of the sample to 7 bits (equivalent to 128 levels). The magnitude means that the sign of the sample value is removed to determine solely its amplitude.

In fact it can be seen that the number of calculations required to generate an output sample is increased only by the need to make a decision for each input sample. The decision needs only to be taken once for each input sample (regardless of how many times this sample needs to be used to calculate subsequent output samples) so in fact represents only a small increase in computational complexity. This is shown in the later detailed description of the process of simulation. Thus it is possible to use a large number of different impulse responses representing, say, 128 different sample levels without increasing the number of calculations by anything like the number of levels used.

Whilst the principle implementations described here take a single impulse response at each level and disregards the sign of the input signal during simulation (using only the magnitude for determining which impulse response to use), it is possible to simulate effects which have significant asymmetrical response by storing responses to both positive and negative going transitions, and applying the one appropriate to the sign of each input sample as well as magnitude.

Improvement by Linear Interpolation of Impulse Responses

Figure 5:
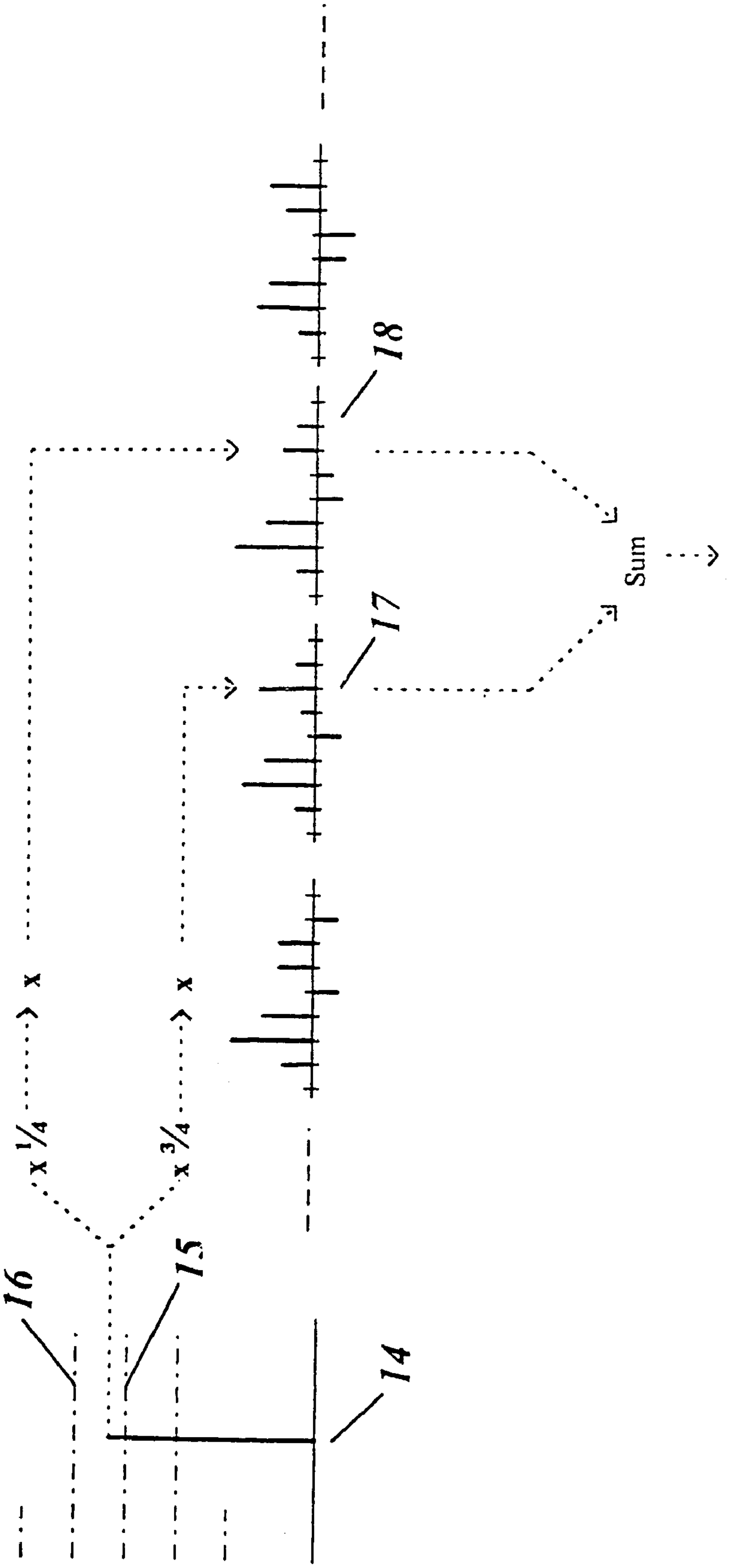
FIG. 5 shows a further refinement where an input sample between two thresholds is applied proportionately to the two impulse responses appropriate to the thresholds on either side of the input sample.

Whilst the above process provides a simulation of the sampled effect, an improvement in distortion characteristics can be made-if desired at the expense of some increase in computational complexity by modifying the process so that instead of selecting between two different impulse response at a given level, a cross-fade effect is used applying a proportion of the input sample to two impulse responses representing two adjacent impulse levels. This is shown in FIG. 5 where a sample (14) a quarter of the way between two sample thresholds (15, 16) is applied three-quarters to the impulse response representing the lower sample level (17) and one quarter to the impulse response representing the higher sample level (18). No calculation needs to be performed with any of the other impulse responses. The computational complexity has thus doubled over the simple case of FIG. 2 plus the additional computation to compute the ratio between the two levels. Although this represents more complexity than of the simple case of FIG. 2, it still represents an acceptable level of complexity to achieve the non-linear characteristic of many simulated effects, as once again this can be evaluated just once for each input sample.

Switching Between Modes

In fact the simulator can be made to switch between the three cases of the simple linear simulator of FIG. 2, the non-linear simulator of FIG. 4 and the improved non-linear simulator of FIG. 5 according to the available computational power and according the length of the impulse responses used. This switching can be achieved by changing the stored program executed by the DSP processors used to implement the system.

Reducing Noise in the Sampled Impulse Response Using an Alternative Sampling Pulse The analysis pulse of FIG. 1 generates an impulse response but the resulting impulse response may also contain noise. Low frequency noise tends to be correlated between adjacent samples and during the resulting simulation phase may lead to either large DC offsets or general low frequency noise on the resulting output.

Figure 6:
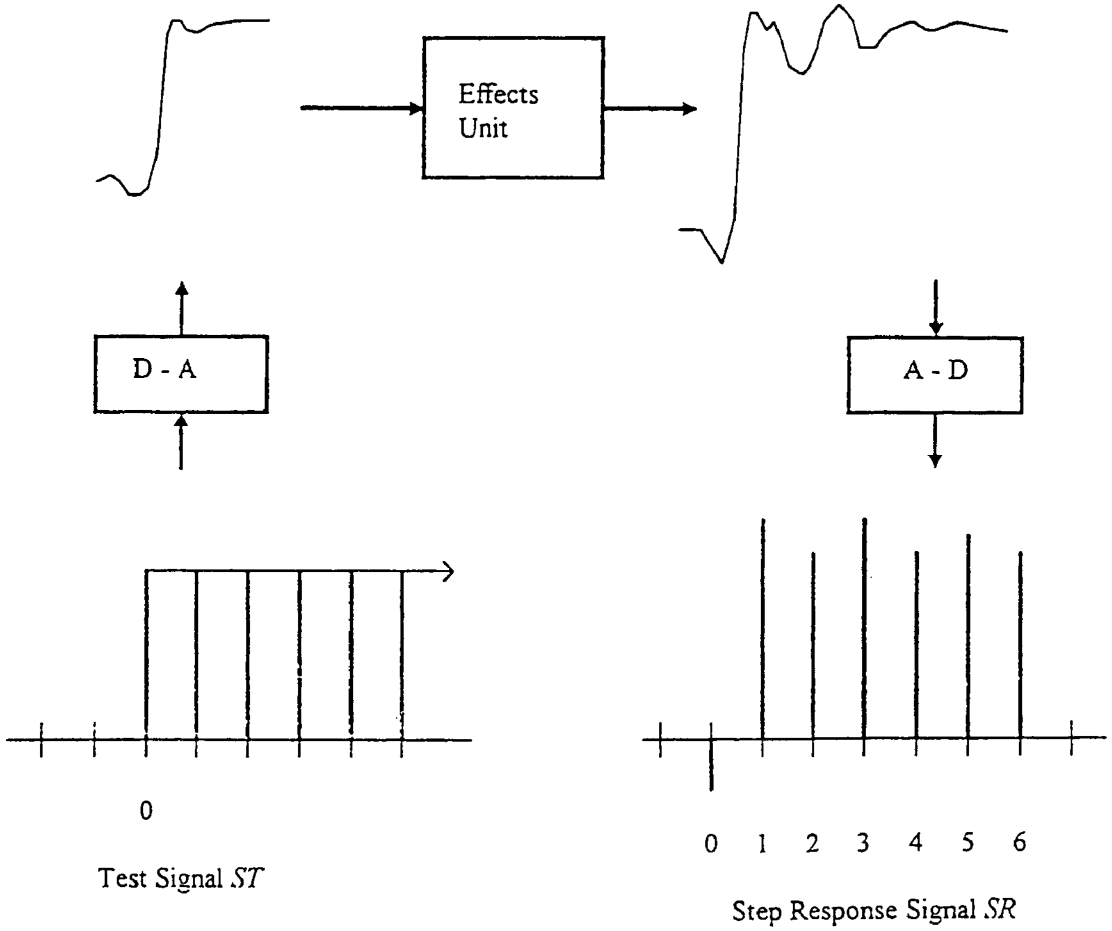
FIG. 6 shows an alternative step pulse that may be applied in the analysis process.

FIG. 6 shows that instead of the unit impulse test signal T of FIG. 1 the step pulse ST may be applied. The step response SR is thus obtained.

Figure 7:
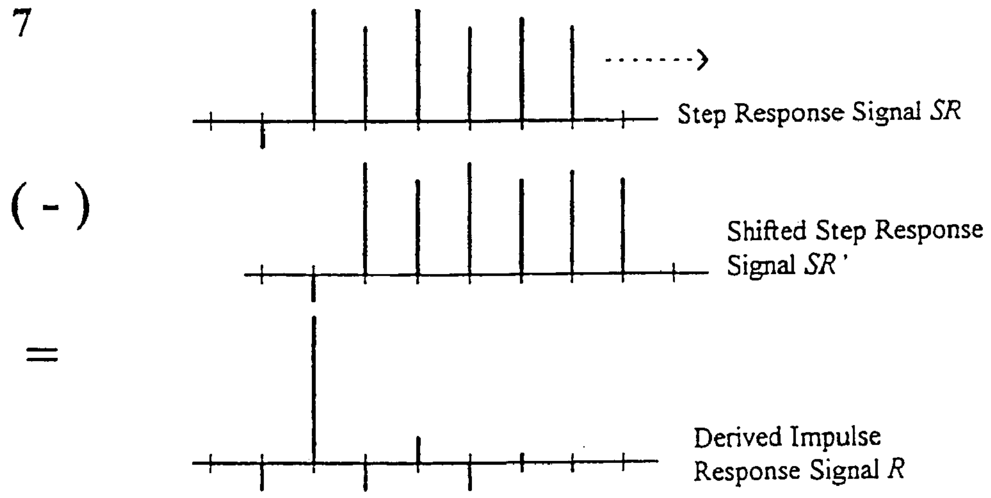
FIG. 7 shows the derivation of the impulse response from the step response by means of a sample shift and a subtraction.

FIG. 7 shows how to recover the unit impulse response required R. The step impulse response SR is shifted on by one sample to get SR which is subtracted sample by sample from the response SR to yield the desired impulse response R. Thus any substantial correlation between samples is largely eliminated, and any DC offset (i.e. a constant bias found on all analysed samples) is totally removed. This can of course be calculated as the impulse response is sampled by storing the previous sample value $S_{n-1}$ and subtracting it from the current sample $S_n$ so the value $S_n-S_{n-1}$ is stored as the desired impulse response.

The desired response at the required number of different amplitudes can be found by using steps of a number of different sizes, as shown in FIG. 15 and described later.

Implementing the Analysis and Simulation

The implementation of the analysis and simulating process will now be described by reference to FIGS. 8 to 18. FIG. 8 shows one arrangement using a stored program computer optimised for digital-signal processing. Typically one or more digital signal processor (DSP) devices 21 are used. The DSP is attached to memory for impulse responses 22 and for digital audio sample, accumulation and control data 23, as well as program memory 24. These may in fact be part of a single general purpose memory array or for example the program memory 24 may be part of a separate array for higher performance. Audio input is provided either via analogue to digital converter 25 or via direct digital input 26 and audio output is fed via digital to analogue converter 27 and via a direct digital output 28. A disk storage subsystem 29 is also connected and a user control panel and display 30 is provided to allow the user to initiate analysis, store or select stored impulse responses, and select simulation modes, as well as initiate editing of impulse responses as described later.

The arrangement of FIG. 8 may generate the analysis pulses, store and process the resultant impulse responses, and produce the simulation by loading the appropriate control program from disk or other storage medium.

One method of implementing the process of simulation will be described first.

FIG. 9 shows the process of reading in samples to be processed. A number of impulse responses derived from the analysis phase are stored in arrays of memories shown at 31, 32 and 33. Three are shown but in practice any number may be used. These are identified by the address in memory of the first element of each response at 34, 35 and 36 and the memory array A can store these memory addresses, or pointers, represented by the arrows shown from memory elements of array A pointing to the appropriate impulse array.

Each input sample arriving has one element of A reserved for it to denote the appropriate pair of impulse responses 31–33. The pointer addresses the lower of the two impulse responses (i.e. the impulse response derived from the lower magnitude analysis impulse) representing the threshold on or below the input sample, and the second impulse response is always the next one above representing the next higher threshold level of the input sample.

Memory arrays $F_1$ $_{and\ F2}$ store a pair of factors which are derived from the input sample and represent the input sample divided into two parts, one of which will be applied to the lower impulse response and one of which will be applied to the higher impulse response. The sum of these two factors is always the input sample value itself and the sample is divided and stored in elements of arrays $F_1$ and $F_2$ according to the proportion to be applied to each impulse response. Each input sample 37 therefore is divided in process 38 and loaded into the next free set of elements of the arrays A, $F_1$, and $F_2$. A pointer 39 is then incremented (to the left in this example) to point into the next set of elements for the next input sample when it arrives.

FIG. 10 shows by means of a flow diagram the details of the process 38. The magnitude |S| of the input sample S is compared with the various thresholds $T_1$, $T_2$ etc representing the levels at which the impulse responses were sampled, to find the two thresholds $T_n$ on or below the sample magnitude, and $T_{n+1}$ above the sample magnitude, i.e. such that $$T_{n}\_\leqq|S|<T_{n+1}.$$

It should be noted that if the number of equally spaced levels is a power of 2 (e.g. 256) the threshold value $T_n$ can be determined by first removing the sign of the sample value then truncation to the number of bits appropriate to the power of 2, (e.g. 8).

The next step is to calculate the proportion by which the sample amplitude exceeds the threshold (shown as factor k), then divide the sample in this proportion to place into arrays $F_1$ and $F_2$.

The input pointer is then advanced ready for the next sample. The array stored will be used for calculating each output samples up to the length of the impulse responses, so after a number of output samples the values just calculated will no longer be required. Standard techniques may be applied to implement a 'circular buffer' where the pointer can be wrapped back to the start after this many samples. thus limiting the size of the arrays. These techniques are well known and do not need to be described further here.

FIG. 11 thus shows the layout of data in memory after a number of samples have been read in and processed to calculate output samples (ignoring any issues relating to circular buffers). In this example and in the process shown in FIG. 12 the parenthesised suffix (0) is used to indicate a value relating to the most recent sample, (1) the next older and so on. For the impulse response the suffix (0) means the first sample in the impulse response buffer (i.e. the first that arrived during the analysis process), (1) the next older etc up to (M−1) which represent the most delayed impulse response sample, where M is the number of samples in each impulse response buffer.

FIG. 12 shows the flow diagram to calculate each output sample. It comprises a main loop starting at 43 which is executed M times for each output sample by means of the control variable J which is zeroed at 41. The output sample is accumulated into the to variable $S_{OUT}$ and so this is zeroed at 42 before entering the loop. The first step in the loop at 43 (for the element J) is to load the impulse response pointer A(J) (being the Jth element of array A). Using this pointer it is possible to load the appropriate impulse response sample from each of the appropriate response arrays. These are referred to as $I_1$ read from A(J)+J (at step 44) and $I_2$ read from A(J)+J+M (at step 45).

The two parts of the input sample $F_1$ and $F_2$ are read from the $F_1$, $F_2$ arrays at offset J at step 46. The two multiply and accumulate steps can be performed to accumulate the output sample into $S_{OUT}$ as shown at step 47. It is then only necessary to increment J (at step 48) and to test this against M (at step 49). When J reaches M the output sample is complete and the loop is finished.

The output sample value may then be fed to the output of the machine (FIG. 8 items 27 and 28). Input pointers can then be moved on one sample ready for the next input sample.

It should be mentioned that if either of the two simplified processes of FIG. 2 or FIG. 4 is to be carried out some simplification of the above processes can be employed. For example, if cross-fading is not to be employed (as described in FIG. 4) the sample is not divided between $F_1$ and $F_2$ but is simply stored wholly in array $F_1$. Thus all $F_2$ values are considered to be zero and so the memory array is no longer required and any steps relating to $F_2$ can be by-passed, i.e. step 45, the second read at step 46 and the second multiply accumulate at 47. If the basic linear simulation of FIG. 2 is required the process is further simplified to eliminate determining the threshold of the input sample, it is simply stored in array F1. Only one address of impulse response is needed so array A is now no longer required and in FIG. 12 step 43 is not required and the sole base address of the one impulse response is used instead of A(J) at step 44.

It will be appreciated that the number of operations can be substantial as the length of the impulse responses used (M) may typically be 5.000 or longer (although useful results can be obtained with responses as short as for example 50 to 200 steps). Accordingly, and depending on the speed of the DSPs it may be necessary to use more than one DSP to operate in real-time.

FIG. 13 shows one possible architecture of a multiple DSP implementation. DSP 51 processes the input sample into the arrays A, $F_1$ and $F_2$ as already described but which are stored in segmented memory arrays 52. This memory is arranged so that it can be wholly accessed by DSP51 for loading with processed input samples, but is separated into sections which can be individually accessed by DSPs 53, 54, 55 etc. Each DSP thus has access to part of each array and for each output sample can perform part of the multiply accumulate loop described in FIG. 12. The resulting parts of the accumulated output sample are written back to more shared memory 56. DSP 51 (which otherwise is not heavily occupied by the input process) then adds all the separate parts together to produce the whole output sample. Thus for example ten processors (53, 54 etc) could be used so that each performs 500 accumulation steps per output sample, and DSP 51 then has to sum the 10 partial values. Thus 5,000 step impulse responses may be subdivided as appropriate to the speed of the DSP processors. Each DSP 53, 54 etc is effectively executing the same program and so may be fed from either the same or separate program memories 57, 58 etc. It is only necessary to map each part of the memory 52 to appear at the same address location in each associated DSP.

It should be mentioned that there are other ways of dividing up the process which is functionally identical, producing identical output for the same data. For example FIG. 14 shows a rearrangement of the process so that the bulk of the processing is done for each input sample, accumulating output as the input samples appear. After the Mth input sample is accumulated into the output sample buffer the first output sample is ready for output. Thereafter after each input sample is accumulated, another output sample is available. This arrangement may suit some DSP architectures better depending on the exact nature of the DSP's instruction set.

Methods of generating 3 alternative analysis pulses will now be described by reference to FIGS. 15 to 18. Other methods are clearly possible.

FIG. 15 shows details of a digital analysis step tone to be applied to a device under test appropriate to a 16-bit digital audio system. Other bit resolutions would require the amplitude of the steps to be varied appropriately in proportion to the resolution. This figure shows an analysis tone with 128 positive transitions of reducing amplitude designed to obtain 128 impulse responses. It also generates 128 negative going pulses which produce responses which can be ignored, or stored if it is desired to analyse and simulate asymmetric performance.

The digital signal to be fed to the device under test (via a D-A converter if the device is analogue) starts at value zero shown at 100. The maximum positive value the signal can reach is shown at 104 to be value 32,767, and the maximum negative value is shown at 103 at −32,768. These are the limits for a 16-bit linear sampling system. At the commencement of the tone at 101 the signal steps negative to a value of −16,384, and remains at this level for 2n samples. The diagram shows a value of n of 4 but in practice a value of n of 4,000 is typically used. After 2n samples, at 102, the signal steps to +16,384, resulting in a positive step of 32,768 which in magnitude represents the largest amplitude of an individual sample in any 16-bit audio stream. Note that at each transition from negative to positive, the step is always twice the magnitude of the negative value.

After a further n sample, at 105, the value steps to −16256. In fact at each negative going transition (107 etc.) the step is to a negative value 128 less in magnitude than the positive value currently being output. Thus the following negative to positive step (at 106 etc.) is 256 less in magnitude than the previous one.

Thus the sequence of 128 positive steps interleaved between the negative steps have the step amplitudes of 32768, 32512, 32256, 32000, 31744, . . . 512, 256.

After the final upward transition to value 128, the final transition at 109 is by −128 to 0. At this point the analysis tone is complete.

The step impulse responses sampled into the analyser may be stored as it arrives (see FIG. 6) for later processing by the method of FIG. 7, or the difference signal required may be derived as the data arrives by subtracting the previous sample value from each sample value as it arrives. There are some benefits of postponing the step of deriving the difference signal until later as it is easier to analyse the noise floor of the system with the unprocessed signal during noise removal or level detection operations described later.

Normally the impulse responses derived from the positive going step impulses only will be used, normalised according to the manner described. If the negative going pulses are also to be used to simulate asymmetric devices, the responses resulting from each negative going transition following each positive going one can be stored and normalised by multiplying each sample value by 32768 and dividing it by the (negative) amplitude of the appropriate step transition. Although the negative transitions are slightly smaller than the positive going ones the resulting responses may each be used as if they were for the matching positive impulse transition with negligible loss of accuracy of the simulation.

A further point about the value of n is that this represents the maximum length of impulse response to be derived from the device under test. Although 4000 is a typical value a larger number must be used if the device under test continues to generate significant response to an impulse for more samples than this. To assist in the later analysis of the tones it is recommended that a multiple of 1,000 samples is used for this value.

This signal may be applied directly to a device under test and the resulting impulses recorded for immediate processing and use, or it may be recorded (for example on a digital tape recorder) for application to the device under test at another place or time. In this case the response of the device under test should also be recorded (preferably with the same sample clock as that used for applying the test signal) and may later be fed back into the analyser system described. The analyser can be set to search for the first significant amount of signal which represents the device under test's response to the transition 101, and from this point determine each response to positive transitions spaced at 2*n* sample intervals. Where the sample clock has differed slightly between the analysis tone and the response sampler, or there is some intrinsic variable delays (for example wow and flutter of a tape recorder) the jitter removal techniques described later can be applied.

The resulting impulse responses are processed by any noise removal algorithms required and the difference signal is derived. The responses are normalised and appropriately windowed for use in simulation.

The process of normalisation requires increasing the amplitude of the impulse responses derived from lower level impulses. It is important not to distort these amplified responses, for example by letting them 'clip' to the peak level storable in the digital representation. A preliminary inspection of the data should be performed to determine any such problem and an attenuation factor generated which is applied equally to all the impulse responses in the set so as to prevent such distortion occurring. This must be done regardless of which method is used to generate the analysis tone.

FIG. 16 shows an alternative test signal which can be applied and FIG. 17 shows a flow diagram describing the process of generating this signal. This method may be used when the device under test is physically connected to the tone generator and analyser device and takes advantage of the fact that the duration of each impulse response can therefore be measured, allowing the impulse response size to be best fitted to the device under test. Where the length of impulse responses desired is limited by other considerations, for example by memory or processing time limitations, it is still possible to wait before applying a subsequent test pulse until the device under test has ceased generating a response to the previous pulse.

Although in this case the sequence is described for a steadily increasing test signal, a decreasing test signal as already described may be used. Values suggested are appropriate to a 16-bit environment where 128 impulses in each direction are required.

Referring to FIG. 17, at step 71 the initial minimum amplitude value is selected. The output stream from the pulse generator is set to the value $-A_0/2$ at step 72 (typically $A_0$ is 256), producing the output step 81 in FIG. 16. At step 73 it is necessary to wait for any resulting response from the unit under test to die out. This will be determined by recognising when the non-DC component of the signal has stopped varying or has reached the noise floor which may be determined before the first stimulation is applied. It would generally be advisable to apply to time limit which can be user selectable in case of a varying noise floor causing an indefinite wait.

The test signal is now generated by stepping the output stream by the amplitude A, by stepping in a direction to cross the zero value, as described at step 74. This is shown at 82 in FIG. 16 for this first value. The resulting output of the device under test is now monitored and stored as the step impulse response (step 75).

At step 76, value A is tested to see if it has reached the maximum step desired (typically 32,768) and if not it is increased (typically by 128) to the next amplitude to test (step 77). The process then loops back to step 73 where any residual response to the stimulation is allowed to die out, then the output is stepped again, this time in the opposite direction. This is shown at 83 in FIG. 16. Once again the output stream is monitored and the signal is stored.

As for the previous signal of FIG. 15, the resulting impulse responses are processed by any noise removal algorithms required and the difference signal is derived. The responses are normalised and appropriately windowed for use in simulation.

Although step impulses are normally used, it is possible to apply simple impulses as suggested in FIG. 3, and FIG. 18 shows how the algorithm of FIG. 17 may be modified to carry out this process. Once again this shows the application of steadily increasing pulses but of course the larger impulses may be applied first. There is a slight benefit of steadily increasing the pulses as any residual effect from a previous impulse will be slightly less than if the pulses are decreasing in value but in practice there are benefits in level setting for example which outweigh this.

In FIG. 18 at step 61 the initial amplitude is typically set to 256. At step 62 it is desirable to wait for any residual effect of a previous signal passing through the unit under test, as some effect devices may continue to generate output for some time after stimulation, for example due to resonances or reverberations. This process is done by monitoring the return signal from the device under test and observing the noise floor. If this is decaying over a short space of time the process simply waits for the noise floor to become stable.

At step 63 a test pulse of the desired amplitude is emitted by setting the output stream to the value A in one sample period and back to zero at the following sample. At step 64 the returning stream is monitored and stored (usually into RAM) until the time limit set by the implementation is reached. This is determined by the number of steps which the simulator can process in real time, or can be limited by memory available or be further limited by user intervention to minimise processing requirements. It should also be noted that the process of step 62 can also be followed to determine when there is no significant further response and further used to shorten the sampling process.

Once the sampling is complete the amplitude is tested at 65 to determine if the process is complete (usually when the signal has reached 32678. If not, the next higher level of amplitude can be loaded into A (typically increasing it by 256) and the loop repeated. Note that an impulse of 32768 cannot in fact be generated in a 16-bit system but the maximum value 32767 can be used with insignificant loss of accuracy.

A useful refinement to any of the above analysis pulses is to allow the system to generate a continuous stream of pulses at user definable amplitudes solely for the purpose of allowing the operator to select the optimum levels of signal to pass through the device under test.

It should be noted that the step of waiting for any residual stimulation of the device under test (shown at step 62 of FIG. 18 and step 73 of FIG. 17) may be replaced by a fixed wait period in many instances where there is not significant energy storage in the device under test. This has a benefit that the output test signal becomes the same for any test and as in the case of the signal of FIG. 15 may be recorded (preferably in digital format) for application to a device remote from the analysis machine. The resulting output from the device under test may also be recorded and can later be analysed by the analysis process. The only significant alteration to the process of analysis is that instead of generating the test pulse it is necessary simply to wait for any significant response to appear in the recorded stream and store this and the following impulse response as being the response to the first test pulse, then similarly wait for the appearance of further responses to later pulses and thus obtain a complete set of impulse responses. This is useful as an operator may simply carry a tape of the test stream and if he encounters a device which he wishes to analyse he simply plays the tape through the device and records the result for later analysis and simulation. A useful refinement to improve this process is to precede the test signal with a short burst of tone which both can be used for level setting and can be recognised at the analysis stage and taken as a trigger to start the process of looking for response signals at a known period after the tone burst.

Although the sampled effect is shown as an analogue device, a digital processor may be sampled by applying the sample impulse directly to the digital input and sampling directly the output impulse response.

Improving Noise

A potential problem with the system is that significant noise generated by the device under test will appear as noise in the simulated effect. This can be made worse when using impulse responses derived at low levels of test. However since many effects become linear as the level through the device decreases it is often just necessary to use a set of impulse responses derived at relatively high levels, and below this threshold of linearity, to use the impulse response derived at the highest linear level in place of all lower impulse responses. This can be done under manual intervention from the operator who can choose a balance between desirable non-linearity and acceptable noise by auditioning the effect of selective replacement.

Where it is not possible to achieve a desirable balance because it is desired to preserve lower level non-linearities where noise is a problem, it is possible to selectively modify parts of the impulse responses derived at low levels by replacement with matching parts of the responses from higher level impulse responses, where the areas to be replaced are determined by evaluating the absolute amplitude of each section of the response and replacing it where the impulse response is seen to be near the noise floor.

FIG. 19 shows some details of this process. A higher level impulse response is shown at (a) and a lower level one at (b). An envelope 91 (at (c)) is generated representing the average level of a local region of the impulse response (b). This is evaluated by calculating the RMS value of the nearby samples, weighted towards the current time for each point in the envelope. In practice this may encompass 400 to 500 samples if the impulses used are say 5000 samples long, or smaller ranges if shorter impulses are to be used. The envelope 91 is compared with a threshold 92 which may be user determined or estimated by comparing with the noise floor determined either by monitoring the device output under no signal conditions. In FIG. 19(*c*) it can be seen that the example envelope 91 falls below the threshold at 93 and rises again above it at 94. From this a cross-fade envelope is generated (d). Using this envelope the impulse response (b) is selectively replaced with impulse response (a) with a soft crossfade of several milliseconds at each end of the replacement (shown as the ramps 95 of the cross-fade envelope) to generate a new impulse response (e) where the lower level area is replaced by the lower noise floor impulse response taken at the higher level (a).

The new impulse response is generated according to the formula $$r=e.a+(1-e).b$$

where e is the cross-fade envelope value, a is the sample value from the higher level impulse response and b is the sample value from the lower level impulse, and r is the resultant sample to replace in the lower level sample. The period (.) represents multiplication. This provides a cross-fade to the higher level impulse response where the lower level signal was below the threshold.

To determine the noise floor automatically it will be seen that for the impulse responses taken at lower levels there will be a level which the envelope never drops below due to noise. The threshold can thus be set say 50% above this and applied progressively from a higher level sample down to the lowest level. It is appropriate to start the process at the impulse response some 12 dB below the maximum, in other words that sampled with a sample pulse about a quarter of the amplitude of the highest sample impulse used.

Length of Impulse Responses and Processing Power

The impulse response lengths required depend on the energy storage characteristics of the effect sampled. Typically an equaliser, valve amplifier or speaker/microphone combinations in short reverberation environments can be simulated with impulse times of up to 1/10th second, or for example 5,000 samples. Each output sample will require the accumulation of 5,000 values of input sample multiplied with 5,000 impulse response samples, or 250 million operations per second assuming a 50,000 sample per second sampling rate. Thus the simple case of FIG. 2 requires 250 million multiply accumulates (MAC) operations on linear arrays of data, while the process shown in FIG. 12 requires correspondingly more steps to be repeated this many times.

Some valve processors and tape-recorders have very short impulse responses and a useful simulation can be achieved with responses as short as 200 samples.

To simulate fully reverberant effects, impulse responses of several seconds can be needed resulting in a proportional increase in processing power. This is quite possible within a network of DSP chips. To make the best use of a particular hardware implementation however the simulator should be arranged to switch amongst the three simulation methods described: the linear simulation of FIG. 2, the simple non-linear simulation of FIG. 4 and the interpolated simulation of FIG. 5 (shown in greater detail in FIG. 8 onwards). This means that in simulations where non-linearity is not required more processing power is available for longer impulse responses and therefore longer reverberant periods.

Windowing of Impulse Responses

It should be noted that where an effect is sampled but the impulse response exceeds the length of sample which it is possible to calculate in real-time in a particular hardware implementation, it is necessary to truncate the impulse response by windowing the response, i.e. effectively fading off the last 1/20th second or so linearly to zero. In fact all sampled impulse responses should be windowed in this way to prevent any glitch effects from suddenly truncated noise signals. Where impulse lengths are short the fade out typically would be across the final quarter of the response signal.

It is also beneficial to apply a fade-in ramp over the first few (for example, 10) samples of the derived impulse response, and for this purpose it is desirable to store a few samples before the actual impulse response is received so this fade-in takes place over the residual noise of the system.

Editing Impulse Responses

Trimming the Start and End

There is always some delay between the application of an impulse to a device and the output response. This results in an equal delay in the simulation. Sometimes the effect can be improved by removing or reducing this delay and in any event this shortens the sample to reduce computational requirement. It is simple to arrange for the operator to trim off samples from the front of the sample—the effect of which he can audition to his taste, or a threshold level can be set on a response to automatically trim off any initial response below this 'noise' threshold. This threshold would typically be applied to the impulse response derived from the highest level sampled signal and once determined, the same amount is trimmed off the start of the whole set of impulse responses.

Frequency Shifting

Interesting variations of the sampled effect may be made by re-sampling each impulse response to a higher or lower frequency using standard re-sampling algorithms. The effect of each change can be auditioned to the taste of the operator. This allows various effects, such as for example the resonances in the sampled effect being matched to dominant frequencies in the signals to be processed.

Combination of Effects

It is possible to simulate the effect of passing a signal through two successive effects by taking each impulse response of the first effect and passing it through the simulation of the second effect to generate a new impulse response for that sample amplitude. This is done for each impulse response of the first effect to achieve the same number of new impulse responses representing the combined effect. In the case of the simple method of FIG. 2 this represents s simple convolution of the impulse responses.

Interpolation and Extrapolation Effects

The set of impulse responses representing the range of levels passing through an effect embodies the non-linear characteristic of the sampled effect. New and interesting effects can be achieved by partially linearising the effect. To do this a subset representing a range of the original set is taken and a new complete set of impulse responses is generated by interpolation of each sample step through the set of impulse responses.

It is also possible to make the non-linearity more extreme by extrapolating beyond the original range. This can result on extreme values of samples and generally the whole sample set will have to be attenuated to keep the output within acceptable limits.

After any such recalculation the operator can again audition the effect to achieve a desired effect. The extrapolation effects will generally become very strange but small amounts of extrapolation may generate desirable distortions.

Arithmetic

As with all good signal processing practise care must be taken with rounding or truncation of digital value. It is best to preserve precision of all calculations to, for example, 32-bits if fixed point arithmetic is used of 24-bits of mantissa if floating point is used. Final digital output can be reduced to the desired digital output format using appropriate and known bit reduction techniques.

Storing Only the First n Responses of a Set

It has been stated that at low levels the impulse responses can become lost in the noise of the device under test. Accordingly the operator can determine the lowest level impulse response which it is desired to use. Below this in the simulation, the lowest specified impulse response is used for all lower sample values.

Accordingly it is not necessary to store the data for the impulse responses that will not be used, but simply to store an indication that the last specified response be used for all lower level samples.

When reloaded for implementing a simulation according to the embodiment of the invention described, the impulse response derived from the lowest level exciting pulse stored is simply replicated to complete the set.

It should be mentioned that an alternative embodiment may change the simulation algorithm so that although sample levels above the lowest level impulse response are subject to selection and interpolation between the appropriate higher level impulse responses, those below the lowest level impulse response present are simply applied to this lowest level response without the need for interpolation. In this situation there is no need to replicate the lowest level response defined in the stored set of data.

Precision of Sampling Clock

In generating a set of impulse responses corresponding to different amplitude impulses it is important that each impulse response is closely correlated with the others. In other words the relationship between the exciting pulse and the resulting response of the device under test must be strictly linked. This requires that the digital input sampling system is locked to the digital output system generating the analysis tone. In addition long term clock accuracy should adhere to good audio design practice so that some time into each impulse response, impulse samples remains correlated between different impulse responses in the set.

In the event that this requirement cannot be met it is still possible to extract a usable impulse response set by means of jitter removal.

Jitter Removal

Where it is impossible to guarantee high accuracy between the timing of the analysis tone and the resulting impulse responses, for example where the impulse response is recorded and reproduced later for analysis, or where the device under test introduces small timing errors (for example when sampling an analogue tape recorder with its intrinsic delay between recording and replaying), it is necessary to re-correlate the impulse responses.

FIG. 20 shows two successive impulse responses at (a) and (b). These are samples at the time intervals indicated by the vertical lines, giving digital samples as shown at (c) and (d). Although the impulse responses are apparently very similar (as would be expected where the exciting impulse was only slightly different in amplitude), due to the fact that time correlation has been lost between the analysis tone and the resulting impulse response it can be seen that the digital signals appear very different although they represent a broadly similar underlying (analogue or implicit) signal. They are thus not suitable for use as members of an impulse response set until the timing inaccuracy is removed.

This may be corrected by up-sampling the digital signal (to n times the original rate, where the diagram shows the case for n=3) by known means (typically accumulating a 'sinc' function for each sample in the digital stream) to achieve the digital signal as shown at (e) and (f), where the interpolated new samples are shown as thinner vertical lines and the underlying (implicit) wave-form is shown dotted.

It is now possible to look for a recognisable characteristic of each signal and typically this can be done by looking first for the peak amplitude of the first impulse response. This is clearly the sample shown at 110. This impulse response can now be decimated to the original sampling rate simply by taking every nth sample to generate the new digital signals at (g) and (h).

For each subsequent impulse response it is now possible to look for the largest amplitude sample with a matching sign to that of the first impulse response (for example that shown at 111), and similarly decimating each impulse response so that this highest point is now precisely correlated with that of the first.

In fact, up-sampling by 64 times together with this pattern matching algorithm gives good results for the example of analysing an analogue tape-recorder, where the impulse responses have a clear initial peak. Higher up-sampling rates may be used if higher precision is desired. Other pattern matching algorithms may be used including allowing the system operator to match the patterns by hand and eye by overlaying images of the digital representations on a display screen. This would be more appropriate for extreme devices under test with very complex impulse responses.

Smoothing over a Range of Impulse Responses in the Set

An impulse response measured at one time may vary slightly from one taken at another time due to various random variations in the device under test. For example when analysing an analogue tape recorder instantaneous gain can vary due to inconsistencies in the tape medium.

Ideally a number of measurements should be taken and the impulse responses for each amplitude excitation pulse can be simply averaged on a sample by sample basis to smooth out these variations. This also reduces the effects of noise in the device under test. For the example of an analogue tape recorder typically 16 sets of measurement may be taken but this depends on the device and auditioning the results obtained. The number of measurements can be increased until a desirable quality of simulation is obtained.

A faster and more convenient way of achieving almost as good results can be achieved by recognising that each impulse response of the set obtained in a single analysis run with the analysis tone differs only slightly from other responses near to it in the set. This is because the variation in impulse response encapsulating the non-linear characteristic of the device under test is generally a gradual one.

Accordingly it is possible to average a number of adjacent impulse responses (on a sample by sample basis) to create a new impulse response. Typically, for the example where there are 128 impulse responses in the set, and it is chosen to smooth over 8 impulse responses: The first impulse response is replaced by the average on the first 8 impulse responses. Then the second is replace by the average of second to the ninth response, the 3rd by the average of the 3rd to the 10th, etc, until the 120th is replace by the average of the 120th to the 128th. This final average is also used to replace response 121 to 128, resulting in a linear lower end of the simulation.

Where the lower level impulse responses are not available because they have not been kept, (for example if they were not stored after the operator decided that they were too near the noise of the device under test), the averaging process must stop n responses from the end, where we are smoothing over n responses. The set of responses is thus reduced by (n−1) and the new last response is used for all lower level samples in the simulation.

Selecting Between Impulse Responses based on Envelope

The non-linear synthesis has been described where the selection between impulse responses of a set and the relevant interpolation is based on the instantaneous sample value for each sample, as shown in FIG. 10.

Useful variations in the simulated effect can be achieved by substituting for the sample level the envelope of the audio signal being processed. This can be implemented by providing user control over two additional parameters, referred to here as 'attack' and 'decay'. The effect already described in FIG. 10 (for the system where only the amplitude of the input sample is considered for the selection criterion) is produced when both these parameters are set equal to 1.

The envelope may be generated by maintaining an ongoing variable named here 'env'. At the start of the process this may be initialised to zero and will quickly attain its correct value.

The flow chart for calculating a new value for the envelope 'env' for each input sample is shown as FIG. 21.

For each sample the sign is removed at step 121 by taking the absolute value of the sample and assigning it to 'v'. The existing envelope is then allowed to decay at step 122 according to the value of the 'decay' parameter. This is an exponential decay towards zero. If 'v' does not exceed the decayed envelope value 'env' we have the value to be used. If it does exceed 'env', determined at step 123, then the new value for env is calculated at step 124. Effectively the value of env is increased towards the value v according to the 'attack' parameter. This would represent an asymptotic growth if the incoming sample values were consistently higher than 'env'.

Finally at 125 the value of env is used instead of the sample value in the algorithm of FIG. 10 to determine the impulse response to be used in the system and the proportions k (in FIG. 10) of each adjacent impulse response to use. Finally the values S.(1−k) and S.k are calculated at the penultimate step of FIG. 10, using the input sample value for S as before to generate the F and $F_2$ values used for calculating the output sample value. The system is ready for the next input sample.

A useful improvement is to store the previous n input samples, and after calculation of the 'env' variable based on the current input sample, to use the input sample value read in n steps previously to generate the output sample, saving the current input sample for n iterations. This allows a sudden increase in input signal to allow the 'env' variable to increase appropriately over a number of steps before the first high level input sample is actually applied to the simulation algorithm. A disadvantage is that this introduces an overall delay into the system. Once again this value of n is usefully made a user controllable value.

Typical values of attack and decay are 10 and 1000 respectively resulting in a rapid adoption of a higher level impulse response when the input signal increases in general amplitude coupled with a slower return to lower amplitude values when the general signal level decays. 'n' can be made variable from 0 up to several time 'attack'.

Where the original device under test contained in-built audio dynamic compression characteristics (e.g. a 'compressor limiter' device) this approach of impulse response selection based on envelope more accurately simulates the way the device under test alters its tonal characteristics and gain at different_levels of applied signal.

Order of Processing Derived Impulse Responses

There has been described a number of operations to be performed on the impulse response data resulting from analysing a device under test. It is necessary to first apply the de-jitter algorithm if this is necessary. Noise measurement and substitution to reduce noise is best performed next. Since the signal has not yet been normalised it is necessary to reduce a higher level impulse response data in proportion when substituting in a lower level impulse response. At this stage the difference signal should be derived if a step analysis pulse was used. Following this the impulse responses should be normalised, and then any smoothing between responses is performed. Finally the responses should be windowed as described.

Further Uses

The process described can be used to simulate effect which are asymmetric by also taking into account the sign of the signal to be processed and taking separate analysis samples for positive going test pulses and negative going test pulses. This asymmetric processing could be appropriate, for example, to simulation of high sound pressure level effects in air where the sound carrying capacity of air is asymmetric.

A further use of the process of selecting between impulse responses is for using some other characteristic than the amplitude of the incoming sample to control selection. For example a number of different effects can be placed into each impulse response memory and be selected between (including using the cross-fading technique) under user control or in a repetitive manner using a control oscillator. In this way a time varying effect can be simulated, for example a rotating Leslie loudspeaker cabinet or a varying flanger or phaser effect. The required impulse responses can either be calculated to generate an effect or an existing unit can be sampled at a number of different settings representing a range which the effect is normally used to sweep through. Thus a Leslie loudspeaker can be analysed at a number of different static positions of the rotating speaker and the resulting set of impulse responses stored. Then cycling through the responses will simulate rotation of the speaker (including the doppler effects of the moving speaker as different impulses responses will have different delays built in representing different direct and indirect signal paths from the loudspeaker analysed).

A refinement of the process allows the combination of non-linear effects with time varying or user controlled effects. In this case instead of one set of impulse responses which are amplitude dependent, a number of sets are stored. The amplitude of the incoming signal determines which impulse response of a set to use, and the time varying or user adjusted parameter selects between sets. To perform smooth cross-fading between effects the interpolator function of FIG. 5 is enhanced to provide a two-dimensional, or bilinear, interpolation between 4 impulse responses with one dimension dependent on signal amplitude and the other dependent on the other parameter. It is of course possible to increase the number of parameters which can be varied simultaneously still further. This is limited by the processing power required to perform the multi-linear interpolation and the storage capacity for the number of impulse response sets required.

Although a monophonic system is described typically two units will run in parallel to allow stereo in and stereo out. Often the input signal will be the same applied to both channels to generate stereo simulated effects from monophonic sources.

It was mentioned that audio processing is used in film dubbing. An example of use of the invention is as follows: Once the effect on an actor's voice has been decided upon in a film production to match the studio recording to the appropriate sound for the scene, the entire process through which the voice track is passed can be analysed and stored. In this case whenever it is necessary to re-record the sound track, for example when dubbing into a foreign language, the effect can be recalled and applied to the relevant speech for the appropriate scene. Thus a film would be made available for dubbing with the audio process for each scene and each voice stored and indexed to speed up the dubbing process.

Non Real Time and General Purpose Computers

Note that it is also possible to process in non-real time using less hardware and this can be done on typical general purpose desk-top computers. However the best use is achieved when operating in real-time whether this is on a high performance general purpose computer implementing the algorithms described or by means of dedicated multiple DSP architectures.

Deriving Impulse Responses from Virtual Systems

It should be noted that as well as sampling existing effects it is quite possible to generate a computer model of a new device and calculate a set of impulse responses. These may then be loaded into the simulator to allow the effect to be auditioned in real-time. In this way the simulator can emulate arbitrary digital effects such as equalisers or simulated physical models e.g. room simulations, and especially non-linear devices such as amplifier or loudspeaker simulations.

In the case of simple equalisers which are linear in character only one impulse response is generated for any chosen equaliser. These can be calculated and loaded rapidly to allow real-time variation of equaliser characteristics. The simulator thus provides a powerful simulator of a wide range of equaliser devices complete with real-time user control of parameters. In practice when a parameter is varied the new impulse response is calculated and loaded and a cross-fade can be performed to the new effect to remove switching effects when parameters are varied. This can be extended to include non-linear Processes by using the multi-dimensional approach described.

While various embodiments of the invention, including variations thereof, are discussed above, the invention is to be defined only by the appended claims.

What is claimed is:

1. A method of simulating an audio effect processor comprising:

a) storing an impulse response of the audio effect processor for each of at least two impulses:

b) repeatedly assessing a characteristic of an input signal;

c) selecting at least one of the impulse responses to apply to the input signal in dependence on the result of the assessment; and d) applying the selected impulse response to the input signal to derive an output signal;

wherein storing an impulse response comprises storing at least two sets of digital samples representing the at least two impulse responses, and applying the selected impulse response comprises convolving each of a set of digital samples of the input signal with said at least two sets of digital samples representing the selected impulse response, to give a second series of digital samples representing the output signal.

2. A method according to claim 1 in which of assessing a characteristic of the input signal comprises assessing its amplitude.

3. A method according to claim 2, in which of selecting an impulse response to apply to the input signal comprises determining whether the amplitude of the input signal is above or below a predetermined threshold.

4. A method according to claim 2, in which of selecting an impulse response to apply to the input signal comprises determining whether or not the amplitude of the input signal falls within a predetermined range, applying more than one impulse response to the input signal if the result of the determination is that the amplitude of the input signal does fall within the predetermined range and deriving the output signal therefrom.

5. A method according to claim 4, in which the more than one impulse responses applied to the input signal are applied in proportions which sum substantially to 1.

6. A method according to claim 5, in which the proportions of the impulse responses applied to the input signal are dependent on the position of the amplitude of the input signal within the predetermined range.

7. A method according to claim 1 in which of selecting an impulse response to apply to the input signal further comprises the step of detecting a user input and selecting the impulse response in dependence thereon.

8. A method according to claim 1 in which of selecting an impulse response to apply to the input signal comprises the step of monitoring a time dependent variable and selecting an impulse response in dependence thereon.

9. Apparatus for simulating an audio effect processor comprising:

(a) means for storing an impulse response of the audio effect processor for each of at least two impulses;

(b) means for repeatedly assessing a characteristic of an input signal;

(c) means for selecting at least one of the impulse responses to apply to the input signal in dependence on the result of the assessment; and (d) means for applying a selected impulse response to the input signal to derive an output signal;

wherein the means for storing the impulse response comprises means for storing at least two sets of digital samples representing the respective impulse responses and the means for applying the stored impulse response comprises means for convolving each of a first series of digital samples representing the assessment of the characteristic of the input signal with the selected set of digital samples representing the selected impulse response, to give a second series of digital samples representing the output signal.

10. Apparatus according to claim 9 in which the means for assessing the characteristic of the input signal comprises means for assessing the amplitude of the input signal.

11. Apparatus according to claim 10 in which the means for selecting an impulse response to apply to the input signal comprises means for determining whether the amplitude of the input signal is above or below a predetermined threshold.

12. Apparatus according to claim 10 in which the means for selecting an impulse response to apply to the input signal comprises means for determining whether or not the amplitude of the input signal falls within a predetermined range and the means for applying more than one impulse response to the input signal does this if the result of the determination is that the amplitude of the input signal is within the predetermined range.

13. A method according to claim 12 in which the more than one impulse responses applied to the input signal are applied in proportions which sums substantially to 1.

14. Apparatus according to claim 13 in which the proportions of the impulse responses applied to the input signal are dependent on the position of the amplitude of the input signal within the predetermined range.

15. Apparatus according to claim 9 in which the means for selecting an impulse response to apply to the input signal further comprises means for detecting a user input to which the selecting means is responsive.

16. Apparatus according to claim 9 in which the means for selecting an impulse response to apply to the input signal comprises means for monitoring a time dependent variable to which the selecting means is responsive.

17. A method according to claim 1, wherein the method further comprises simulating a plurality of different audio processors and storing the impulse response for the plurality of different audio processors.

18. Apparatus according to claim 9, wherein the apparatus is capable of simulating a plurality of different audio processors; and wherein the means for storing stores impulse responses for the plurality of different audio processors.

* * * * *